(12) United States Patent
Naito et al.

(10) Patent No.: US 10,177,069 B2
(45) Date of Patent: Jan. 8, 2019

(54) HEAT-DISSIPATING STRUCTURE AND SEMICONDUCTOR MODULE USING SAME

(71) Applicant: HITACHI, LTD., Tokyo (JP)

(72) Inventors: Takashi Naito, Tokyo (JP); Motomune Kodama, Tokyo (JP); Takuya Aoyagi, Tokyo (JP); Shigeru Kikuchi, Tokyo (JP); Takashi Nogawa, Tokyo (JP); Mutsuhiro Mori, Tokyo (JP); Eiichi Ide, Tokyo (JP); Toshiaki Morita, Tokyo (JP); Akitoyo Konno, Tokyo (JP); Taigo Onodera, Tokyo (JP); Tatsuya Miyake, Tokyo (JP); Akihiro Miyauchi, Tokyo (JP)

(73) Assignee: HITACHI LTD., Tokyo (JP)

( * ) Notice: Subject to any disclaimer, the term of this patent is extended or adjusted under 35 U.S.C. 154(b) by 0 days.

(21) Appl. No.: 15/501,374

(22) PCT Filed: Sep. 9, 2015

(86) PCT No.: PCT/JP2015/075526
§ 371 (c)(1),
(2) Date: Feb. 2, 2017

(87) PCT Pub. No.: WO2016/043095
PCT Pub. Date: Mar. 24, 2016

(65) Prior Publication Data
US 2017/0236768 A1     Aug. 17, 2017

(30) Foreign Application Priority Data
Sep. 19, 2014 (JP) .................................. 2014-190671

(51) Int. Cl.
*C03C 8/02* (2006.01)
*C03C 8/08* (2006.01)
(Continued)

(52) U.S. Cl.
CPC ............ *H01L 23/3733* (2013.01); *C03C 8/02* (2013.01); *C03C 8/08* (2013.01); *C03C 8/24* (2013.01);
(Continued)

(58) Field of Classification Search
CPC ......... H01L 23/3733; C03C 8/02; C03C 8/08; C03C 8/23
See application file for complete search history.

(56) References Cited

U.S. PATENT DOCUMENTS 5,085,923 A * 2/1992 Yamakawa ........... C04B 35/581
257/E23.009
5,334,558 A * 8/1994 Dietz ..................... C03C 3/122
106/1.14

(Continued)

FOREIGN PATENT DOCUMENTS

CN      102190440 A    9/2011
JP      2013-032255 A   2/2013

(Continued)

OTHER PUBLICATIONS

Chinese Office Action dated Sep. 19, 2018 for the Chinese Patent Application No. 201580034016.7.

*Primary Examiner* — Moazzam Hossain
*Assistant Examiner* — Warren H Kilpatrick
(74) *Attorney, Agent, or Firm* — Volpe and Koenig, P.C.

(57) ABSTRACT

A heat-dissipating structure is formed by bonding a first member and a second member, each being any of a metal, ceramic, and semiconductor, via a die bonding member; or a semiconductor module formed by bonding a semiconductor chip, a metal wire, a ceramic insulating substrate, and a heat-dissipating base substrate including metal, with a die bonding member interposed between each. At least one of the die bonding members includes a lead-free low-melting-point glass composition and metal particles. The lead-free (Continued)

low-melting-point glass composition accounts for 78 mol % or more in terms of the total of the oxides V2O5, TeO2, and Ag2O serving as main ingredients. The content of each of TeO2 and Ag2O is 1 to 2 times the content of V2O5, and at least one of BaO, WO3, and P2O5 is included as accessory ingredients, and at least one of Y2O3, La2O3, and Al2O3 is included as additional ingredients.

13 Claims, 6 Drawing Sheets

(51) Int. Cl.
    *C03C 8/24*     (2006.01)
    *H01L 23/373*     (2006.01)
    *C09J 1/00*     (2006.01)
    *C09J 11/04*     (2006.01)
    *H01L 21/52*     (2006.01)
    *H01L 25/07*     (2006.01)
    *H01L 25/18*     (2006.01)
    *H01L 23/00*     (2006.01)

(52) U.S. Cl.
CPC .................. *C09J 1/00* (2013.01); *C09J 11/04* (2013.01); *H01L 21/52* (2013.01); *H01L 23/3731* (2013.01); *H01L 23/3735* (2013.01); *H01L 24/29* (2013.01); *H01L 25/07* (2013.01); *H01L 25/18* (2013.01); *H01L 2224/29211* (2013.01); *H01L 2224/29224* (2013.01); *H01L 2224/29239* (2013.01); *H01L 2224/29247* (2013.01); *H01L 2224/29287* (2013.01); *H01L 2224/48091* (2013.01); *H01L 2224/48227* (2013.01); *H01L 2224/73265* (2013.01)

(56) References Cited

U.S. PATENT DOCUMENTS

| 2011/0198029 | A1 | 8/2011 | Schoen |
| 2014/0145122 | A1* | 5/2014 | Sawai ............. H01J 29/90 |
| | | | 252/514 |
| 2014/0287227 | A1 | 9/2014 | Kodama et al. |
| 2015/0008573 | A1 | 1/2015 | Sawai et al. |

FOREIGN PATENT DOCUMENTS

| JP | 2013-103840 A | 5/2013 |
| JP | 2013-151396 A | 8/2013 |
| JP | 2014-187251 A | 10/2014 |
| WO | 2012/020694 A1 | 2/2012 |
| WO | 2013/111434 A | 8/2013 |

* cited by examiner ($T_g$: TRANSITION POINT, $M_g$: YIELD POINT, $T_s$: SOFTENING POINT, $T_{cry}$: CRYSTALLIZATION START TEMPERATURE)

(a)

(b)

(c)

HEAT-DISSIPATING STRUCTURE AND SEMICONDUCTOR MODULE USING SAME

TECHNICAL FIELD

The present invention relates to a heat-dissipating structure in which members made of metal, ceramics, and a semiconductor are bonded with die bonding members interposed therebetween and a semiconductor module using the heat-dissipating structure.

BACKGROUND ART

A semiconductor module, which is mounted on a power apparatus, a railroad vehicle, an automobile, or the like, requires high operating current density and high voltage resistance. Generally, the semiconductor module includes a heat-dissipating structure in which a semiconductor chip, a metal wire, a ceramic insulating substrate, and a heat-dissipating base substrate are bonded by die bonding members considered in terms of a heat dissipation property. Further, a metal substrate is placed between a ceramic insulating substrate and a heat-dissipating base substrate in order to reduce the warpage of the ceramic insulating substrate, and the substrates are bonded by die bonding members. Solder or silver solder has been used in the past as the die bonding member. Recently, active silver solder or the like, which can be bonded, has been applied in addition to lead-free tin-based solder or metal considered in terms of an influence on environmental burden. Tin-based solder is used for bonding between the semiconductor chip and the metal wire and bonding between the ceramic insulating substrate and the heat-dissipating base substrate. At that time, solder cannot be directly bonded to the semiconductor chip and the ceramic insulating substrate regardless of whether or not solder contains lead. Accordingly, metalizing, such as plating, needs to be performed on the bonding surfaces of the semiconductor chip and the ceramic insulating substrate in advance. Active silver solder is used for bonding between the metal wire and the ceramic insulating substrate and bonding between the ceramic insulating substrate and a metal substrate that reduces the warpage of the ceramic insulating substrate.

It is important for the above-mentioned semiconductor module to efficiently dissipate heat generated from the semiconductor chip during operation. For this reason, the respective components of the semiconductor module are required to have high thermal conductivity and a coefficient of thermal expansion that is close to the coefficient of thermal expansion of the semiconductor chip as much as possible; and copper (Cu) or the like is applied for the metal wire, aluminum nitride (AlN) or the like is applied for the ceramic insulating substrate, and Al—SiC, which is made of aluminum (Al) and silicon carbide (SiC), or the like is applied for the heat-dissipating base substrate. Further, since a higher operating current density has been required in recent years, the semiconductor chip has generated more heat. For this reason, the material of the semiconductor chip is about to be changed to silicon carbide (SiC), which is excellent in an operation at a high temperature, from silicon (Si) that has been used until now. In addition, the semiconductor module requires more excellent heat resistance, a more excellent heat dissipation property, and more excellent heat cycle characteristics. Particularly, the appearance of a die bonding member, which significantly affects the thermal reliability of the semiconductor module, has thermal reliability higher than the thermal reliability of existing lead-free tin-based solder or existing active silver solder, and allows bonding, as the die bonding member is expected.

PTL 1 proposes a die bonding member that contains a lead-free low-melting glass composition containing $V_2O_5$ and metal particles. According to this die bonding member, the bondability and thermal conductivity of a semiconductor module or a joined body to which any of metal, ceramics, and a semiconductor is bonded can be improved. Further, $V_2O_5$—$TeO_2$—$Ag_2O$-based low-melting glass of which the softening point is significantly low is proposed as one example of the lead-free low-melting glass composition containing $V_2O_5$, and it is effective that the $V_2O_5$—$TeO_2$—$Ag_2O$-based low-melting glass contains 5 to 65 mass % of $V_2O_5$, 15 to 50 mass % of $TeO_2$, and 10 to 60 mass % of $Ag_2O$.

CITATION LIST

Patent Literature

PTL 1: JP 2013-151396 A

SUMMARY OF INVENTION

Technical Problem

The softening point of the above-mentioned $V_2O_5$—$TeO_2$—$Ag_2O$-based low-melting glass is certainly lower than the softening point of other low-melting glass, but the crystallization of the above-mentioned $V_2O_5$—$TeO_2$—$Ag_2O$-based low-melting glass easily occurs during heating and burning. For this reason, the softening flowability of the above-mentioned $V_2O_5$—$TeO_2$—$Ag_2O$-based low-melting glass deteriorates due to the crystallization tendency thereof. When metal particles are mixed to the above-mentioned $V_2O_5$—$TeO_2$—$Ag_2O$-based low-melting glass or the above-mentioned $V_2O_5$—$TeO_2$—$Ag_2O$-based low-melting glass is used in the form of paste, this crystallization more significantly occurs. When the softening flowability of the glass is impaired due to the crystallization of the glass, high adhesion to a material to be bonded (metal, ceramics, or a semiconductor) is not obtained and a plurality of bubbles are likely to remain. For this reason, it is difficult to provide a heat-dissipating structure and a semiconductor module that are excellent in both bondability and a heat dissipation property. In addition, since the bondability and the heat dissipation property of the heat-dissipating structure and the semiconductor module are insufficient, the heat cycle characteristics of the heat-dissipating structure and the semiconductor module are also not good. That is, there is a big problem in the improvement or enhancement of thermal reliability.

An object of the invention is to provide a heat-dissipating structure and a semiconductor module that are excellent in thermal reliability.

Solution to Problem

In order to achieve the object, the present invention is a heat-dissipating structure including: a first member and a second member each of which is one of metal, ceramics, and a semiconductor and which are bonded to each other with a die bonding member, which contains a lead-free low-melting glass composition and metal particles, interposed therebetween, wherein the lead-free low-melting glass composition contains $V_2O_5$, $TeO_2$, and $Ag_2O$ serving as main ingredients of which the total content is 78 mol % or more in terms of oxides ($V_2O_5$, $TeO_2$, and $Ag_2O$), the content of each of $TeO_2$ and $Ag_2O$ is 1 to 2 times the content of $V_2O_5$, and the lead-free low-melting glass composition further contains one or more kinds of BaO, $WO_3$, and $P_2O_5$ serving as accessory ingredients of which the total content is 20 mol % or less and one or more kinds of $Y_2O_3$, $La_2O_3$, and $Al_2O_3$ serving as additional ingredients of which the total content is 2.0 mol % or less.

In addition, the present invention is a semiconductor module including: a semiconductor chip, a metal wire, a ceramic insulating substrate, and a heat-dissipating base substrate containing metal that are bonded with die bonding members interposed therebetween, respectively, wherein one or more of the die bonding members contain a lead-free low-melting glass composition and metal particles, the lead-free low-melting glass composition contains $V_2O_5$, $TeO_2$, and $Ag_2O$ serving as main ingredients of which the total content is 78 mol % or more in terms of oxides ($V_2O_5$, $TeO_2$, and $Ag_2O$), the content of each of $TeO_2$ and $Ag_2O$ is 1 to 2 times the content of $V_2O_5$, and the lead-free low-melting glass composition further contains one or more kinds of BaO, $WO_3$, and $P_2O_5$ serving as accessory ingredients of which the total content is 20 mol % or less and one or more kinds of $Y_2O_3$, $La_2O_3$, and $Al_2O_3$ serving as additional ingredients of which the total content is 2.0 mol % or less.

Advantageous Effects of Invention

According to the invention, it is possible to provide a heat-dissipating structure and a semiconductor module that are excellent in thermal reliability.

DESCRIPTION OF EMBODIMENTS

Embodiments of the invention will be described in more detail below with reference to the drawings. However, the invention is not limited to embodiments to be described here and may have appropriate combinations or improvements without departing from the gist.

(Heat-Dissipating Structure)

Figure 1:
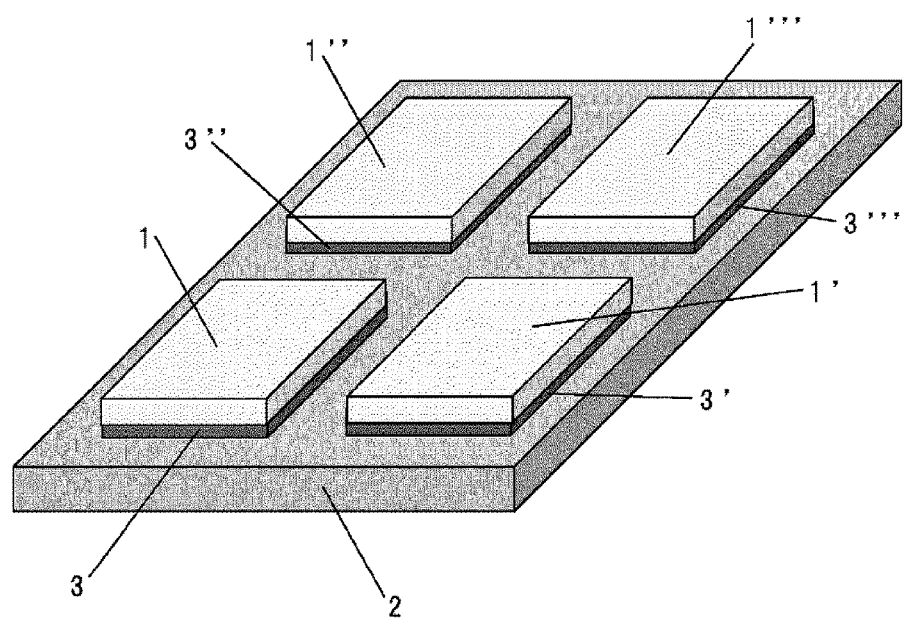
FIG. 1 is a schematic perspective view of a heat-dissipating structure according to an embodiment of the invention.
Figure 2:
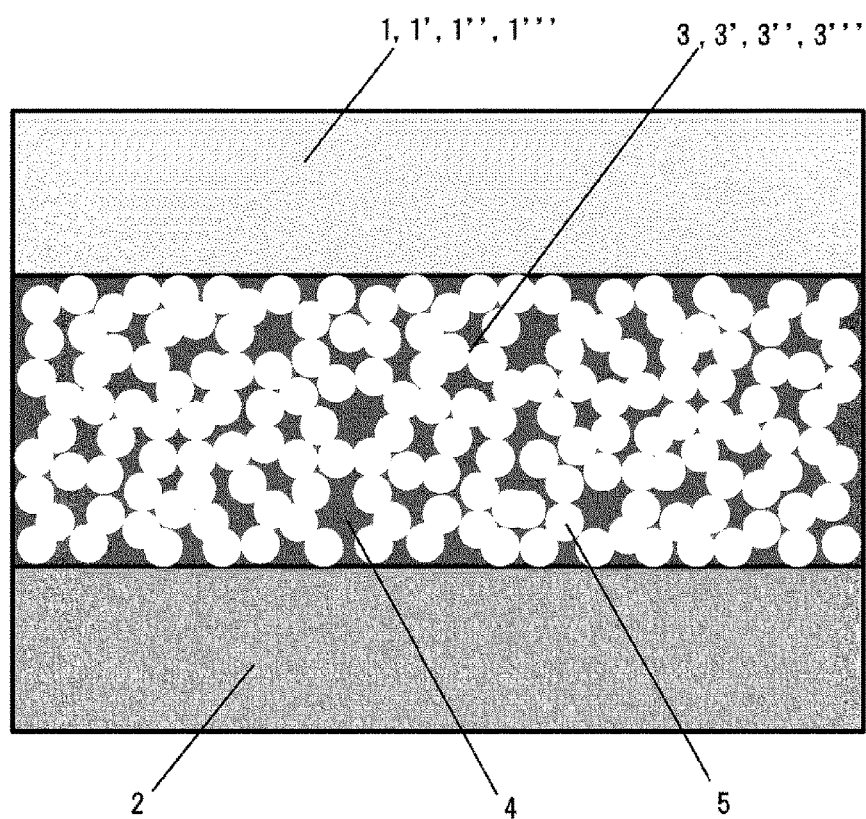
FIG. 2 is a schematic enlarged cross-sectional view of a bonded portion of the heat-dissipating structure illustrated in FIG. 1.

A schematic perspective view of a typical heat-dissipating structure is illustrated in FIG. 1, and a schematic enlarged cross-sectional view of a bonded portion of the heat-dissipating structure is illustrated in FIG. 2. This embodiment relates to a heat-dissipating structure including first members 1, 1', 1'', and 1''' and a second member 2, each of which is one of metal, ceramics, and a semiconductor and which are bonded to each other with die bonding members 3, 3', 3'', and 3''' interposed therebetween, respectively, as illustrated in FIGS. 1 and 2. A lead-free low-melting glass composition 4 and metal particles 5 are contained in the die bonding members 3, 3', 3'', and 3'''.

The lead-free low-melting glass composition 4 contains $V_2O_5$, $TeO_2$, and $Ag_2O$ serving as main ingredients of which the total content is 78 mol % or more in terms of oxides ($V_2O_5$, $TeO_2$, and $Ag_2O$), the content of $TeO_2$ is 1 to 2 times the content of $V_2O_5$, and the content of $Ag_2O$ is 1 to 2 times the content of $V_2O_5$. The most notable characteristic is to apply a $V_2O_5$—$TeO_2$—$Ag_2O$-based lead-free low-melting glass composition that further contains one or more kinds of BaO, $WO_3$, and $P_2O_5$ serving as accessory ingredients of which the total content is 20 mol % or less and one or more kinds of $Y_2O_3$, $La_2O_3$, and $Al_2O_3$ serving as additional ingredients of which the total content is 2.0 mol % or less. Meanwhile, "lead-free" means that lead of which the amount is equal to or larger than the amount of impurities is not contained and lead of which the amount is equal to the amount of unavoidable impurities is permitted.

An effect of the containing of $V_2O_5$, $TeO_2$, and $Ag_2O$, which are main ingredients, in the lead-free low-melting glass composition will be described below. $Ag_2O$ is contained to lower characteristic temperatures, such as a transition point, a yield point, and a softening point, and to improve chemical stability. $V_2O_5$ is contained to prevent metal Ag from being precipitated through the reduction of $Ag_2O$ at the time of the production of glass. When $Ag_2O$, which is contained as a glass ingredient, is not present in glass in the state of $Ag^+$ ions, a predetermined effect of lowering the characteristic temperatures is not obtained. When the content of $Ag_2O$ is increased, that is, when the amount of $Ag^+$ ions in glass is increased, the characteristic temperatures are lowered. However, it is also necessary to increase the content of $V_2O_5$ in order to prevent or suppress the precipitation of metal Ag at that time. At the time of the production of glass, two $Ag^+$ ions per $V^{5+}$ ion can be contained in glass at most. There is a possibility that metal Ag may be precipitated when the number of $Ag^+$ ions per $V^{5+}$ ion is larger than two.

$TeO_2$ is a vitrification ingredient that is used to be vitrified at the time of the production of glass. For this reason, if $TeO_2$ is not contained, glass cannot be formed. However, since one $Te^{4+}$ ion per $V^{5+}$ ion is effective at most, there is a possibility that a compound of Te and Ag may be precipitated when the number of $Te^{4+}$ ions per $V^{5+}$ ion is larger than one.

Considering the effect of the containing of $V_2O_5$, $TeO_2$, and $Ag_2O$, it is preferable that the lead-free low-melting glass composition according to this embodiment contains $V_2O_5$, $TeO_2$, and $Ag_2O$ of which the total content is 78 mol % or more in terms of oxides ($V_2O_5$, $TeO_2$, and $Ag_2O$) and each of the content of $TeO_2$ and the content of $Ag_2O$ is 1 to 2 times the content of $V_2O_5$. When the contents of the ingredients are less than or more than these composition ranges, there is a possibility that a problem, such as the precipitation of metal Ag at the time of the production of glass, the reduction of an effect of lowering the characteristic temperatures, the significant occurrence of crystallization during heating and burning, or the deterioration of chemical stability, may occur.

Further, in order to easily obtain the lead-free low-melting glass composition according to this embodiment in the state of uniform glass (amorphous state) and in order not to promote the crystallization tendency of obtained glass, it is desirable that one or more kinds of BaO, $WO_3$, and $P_2O_5$ of which the total content is 20 mol % or less are contained as accessory ingredients. The reason for this is that the characteristic temperatures rise when the total content of the accessory ingredients is more than 20 mol %. When a small amount of $Y_2O_3$, $La_2O_3$, and $Al_2O_3$, which are contained as the additional ingredients, is contained, there is an effect of significantly reducing the crystallization tendency and it is effective that the content of the additional ingredients is 2.0 mol % or less. The reason for this is that characteristic temperatures, such as a transition point, a yield point, and a softening point, rise or the crystallization tendency is increased when the content of the additional ingredients is more than 2.0 mol %. The effective content of the accessory ingredients is in the range of 3.7 to 16 mol %, and the effective content of the additional ingredients is in the range of 0.2 to 1.0 mol %.

Since the above-mentioned $V_2O_5$—$TeO_2$—$Ag_2O$-based low-melting glass composition is excellent in wettability or reactivity with Al, an Al alloy, Ag, and an Ag alloy, it is effective that a film made of Al, an Al alloy, Ag, or an Ag alloy is formed on each of bonding surfaces of the first members 1, 1', 1", and 1''' and the second member 2 illustrated in FIGS. 1 and 2 in advance. Accordingly, better bondability is obtained. Further, it is effective that one or more kinds of Ag, Al, Sn, and Cu are contained in the metal particles 5 contained in the die bonding members 3, 3', 3", and 3'''. These metal particles are easily subjected to necking by the softening and flowing of the $V_2O_5$—$TeO_2$—$Ag_2O$-based lead-free low-melting glass composition 4 and a good heat dissipation property is obtained.

Figure 3:
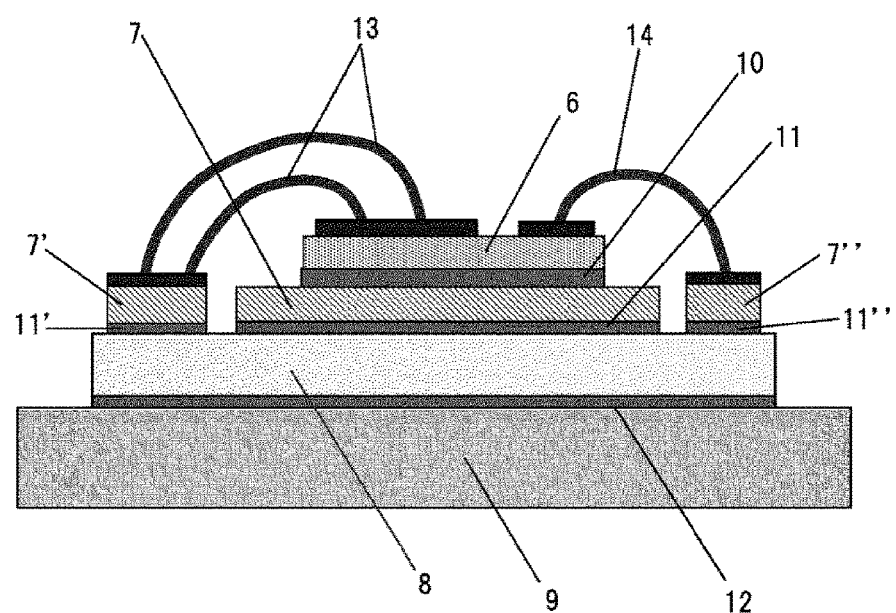
FIG. 3 is a schematic cross-sectional view of a semiconductor module according to an embodiment of the invention.

Typical examples of an embodiment to which the heat-dissipating structure of this embodiment is applied may include a semiconductor module. FIG. 3 illustrates a schematic cross-sectional view of a typical semiconductor module. In this semiconductor module, a semiconductor chip 6 and a metal wire 7 are bonded to each other with a first die bonding member 10 interposed therebetween, the metal wire 7 and a ceramic insulating substrate 8 are bonded to each other with a second die bonding member 11 interposed therebetween, and the ceramic insulating substrate 8 and a heat-dissipating base substrate 9 are bonded to each other with a third die bonding member 12 interposed therebetween. Further, emitter electrodes 13 are electrically connected to a metal wire 7' from the upper surface of the semiconductor chip 6, and a gate electrode 14 is electrically connected to a metal wire 7" from the upper surface of the semiconductor chip 6.

At the time of the operation of the semiconductor module, the semiconductor chip 6 generates heat until the temperature of the semiconductor chip 6 becomes high temperature. Accordingly, this heat is dissipated from the heat-dissipating base substrate 9 through the first die bonding member 10, the metal wire 7, the second die bonding member 11, the ceramic insulating substrate 8, and the third die bonding member 12. For this reason, the metal wire 7, the first die bonding member 10, the ceramic insulating substrate 8, the second die bonding member 11, the third die bonding member 12, and the heat-dissipating base substrate 9 are more effective as the thermal conductivity thereof is higher.

Si or SiC is applied to the semiconductor chip 6, Cu or Al is applied to the metal wire 7, AlN or $Si_3N_4$ is applied to the ceramic insulating substrate 8, and Al—SiC is applied to the heat-dissipating base substrate 9. Lead-free tin-based solder or active silver solder has been used so far for the first to third die bonding members 10 to 12 so that the first to third die bonding members 10 to 12 can be bonded at a low temperature and can be bonded to ceramics. However, lead-free tin-based solder or active silver solder is not pure metal but an alloyed material, and alloying causes thermal conductivity to be lowered and causes a heat dissipation property to deteriorate. Further, since alloying causes a material to be embrittled by exposure to high temperature or a heat cycle, the alloying causes the thermal reliability of the semiconductor module to be reduced. It is possible to improve the heat dissipation property, heat resistance, and heat cycle characteristics of the semiconductor module by developing the above-mentioned die bonding member to one or more of the first to third die bonding members 10 to 12 in the semiconductor module of this embodiment.

EXAMPLES

The invention will be described in more detail below on the basis of specific examples. However, the invention is not limited to examples to be described here and includes variations thereof.

Example 1

In this example, a lead-free low-melting glass composition contained in the die bonding member, which is used to produce the heat-dissipating structure and the semiconductor module illustrated in FIGS. 1 to 3, was produced and an influence of the composition of the lead-free low-melting glass composition on the characteristics of glass was examined. Further, the thermal conductivity of a sample, which was produced by mixing 90 vol % of Ag particles serving as the metal particles to the produced lead-free low-melting glass composition and heating and burning the mixture, was evaluated. Furthermore, a paste for the die bonding member was produced by mixing 90 vol % of Ag particles serving as the metal particles to the produced lead-free low-melting glass composition, and was applied to a member made of metal, ceramics, or a semiconductor, and was dried, burned, and joined for the examination of the bondability of the paste to each member.

Further, bonding temperature, thermal conductivity, and bondability of a die bonding member, which contains the lead-free low-melting glass composition and the metal particles, were comprehensively evaluated. Table 1 illustrates the composition of each produced lead-free low-melting glass composition. The main ingredients of the produced lead-free low-melting glass composition are $V_2O_5$, $TeO_2$, and $Ag_2O$; the accessory ingredients thereof are BaO, $WO_3$, and $P_2O_5$; and the additional ingredients thereof are $Y_2O_3$, $La_2O_3$, and $Al_2O_3$. Furthermore, Table 2 illustrates the results of the vitrified states, the characteristic temperatures, the crystallization tendency, and the chemical stability of the produced lead-free low-melting glass compositions. Table 3 illustrates the results of bonding temperature, thermal conductivity, and the evaluation of bondability to metal, ceramics, and a semiconductor when a die bonding member contains 10 vol % of a lead-free low-melting glass composition and 90 vol % of Ag particles. Moreover, Table 3 also illustrates the results of the comprehensive evaluation of bonding temperature, the thermal conductivity, and the bondability.

(Production of Lead-Free Low-Melting Glass Composition)

Lead-free low-melting glass compositions G-01 to G-77 illustrated in Table 1 were produced. The composition illustrated in Table 1 is blending composition at the time of the production of glass. All units in Table 1 are mol %. G-01 to G-19 and G-72 to G-77 are Comparative Examples, and G-20 to G-71 are Examples. The powder of $V_2O_5$ manufactured by Shinko Chemical Co., Ltd., the powder of $TeO_2$ manufactured by Kojundo Chemical Laboratory Co., Ltd., the powder of $Ag_2O$ manufactured by Wako Pure Chemical Industries, Ltd., the powder of $BaCO_3$ manufactured by Kojundo Chemical Laboratory Co., Ltd., the powder of $WO_3$ manufactured by Kojundo Chemical Laboratory Co., Ltd., the powder of $P_2O_5$ manufactured by Kojundo Chemical Laboratory Co., Ltd., the powder of $Y_2O_3$ manufactured by Kojundo Chemical Laboratory Co., Ltd., the powder of $La_2O_3$ manufactured by Kojundo Chemical Laboratory Co., Ltd., and the powder of $Al_2O_3$ manufactured by Kojundo Chemical Laboratory Co., Ltd. were used as starting materials.

The powder of the respective starting materials were weighed out so that the total mass of the powder of the respective starting materials is about 200 g, were blended and mixed, and were put in a quartz glass crucible. The quartz glass crucible in which the mixed powder of the materials was put was installed in a glass melting furnace and was heated up to 700 to 750° C. at a rate of temperature rise of about 10° C./minute, and melt present in the quartz glass crucible was kept for one hour while being stirred by an alumina rod so that the composition of the melt was made uniform. After that, the quartz glass crucible was taken out of the glass melting furnace and the melt was poured into a stainless-steel mold heated up to about 120° C. in advance, so that the lead-free low-melting glass compositions G-01 to G-77 were produced. Next, the produced lead-free low-melting glass compositions were pulverized until the produced lead-free low-melting glass compositions had a particle size of about 10 µm.

(Evaluation of Vitrified State)

The vitrified states of the produced lead-free low-melting glass compositions G-01 to G-77 were evaluated by the determination of whether or not crystals were precipitated that was performed using the powder of the glass through X-ray diffraction. Table 2 illustrates the results of evaluation. When crystals are precipitated, sharp diffraction peaks are observed. On the other hand, when crystals are not precipitated, only broad diffraction peaks are observed. Since the vitrified state of a lead-free low-melting glass composition where a sharp diffraction peak was not recognized was regarded as a good vitrified state, the lead-free low-melting glass composition was evaluated as "pass". On the other hand, when a sharp diffraction peak was recognized, crystals were already precipitated and a vitrified state was not a uniform amorphous state. Accordingly, a lead-free low-melting glass composition was evaluated as "fail". When crystals are already precipitated at the time of the production of glass, crystallization is promoted by heating and burning to be performed later and good softening flowability is not obtained. For this reason, it is not preferable that crystals are already precipitated at the time of the production of glass. When good softening flowability is not obtained, the bondability or adhesion and compactness of a die bonding member become insufficient.

(Characteristic Temperatures and Evaluation of Crystallization Tendency)

The characteristic temperatures and crystallization tendency of the produced lead-free low-melting glass compositions G-01 to G-77 were evaluated using the powder of the glass through differential thermal analysis (DTA). Table 2 illustrates the results of evaluation. In the DTA, a macrocell type was used, about 500 mg of the powder of glass was put in the macrocell, the powder of highly-pure alumina ($\alpha$-$Al_2O_3$) was used as a standard sample, the powder of glass was heated up to 400° C. from room temperature in the air at a rate of temperature rise of 5° C./minute, and the DTA curve of each of the produced lead-free low-melting glass compositions was measured. Transition points $T_g$, yield points $M_g$, softening points $T_s$, crystallization start temperatures $T_{cry}$, and the amount of heat generated due to crystallization were obtained from the measured DTA curves.

Figure 4:
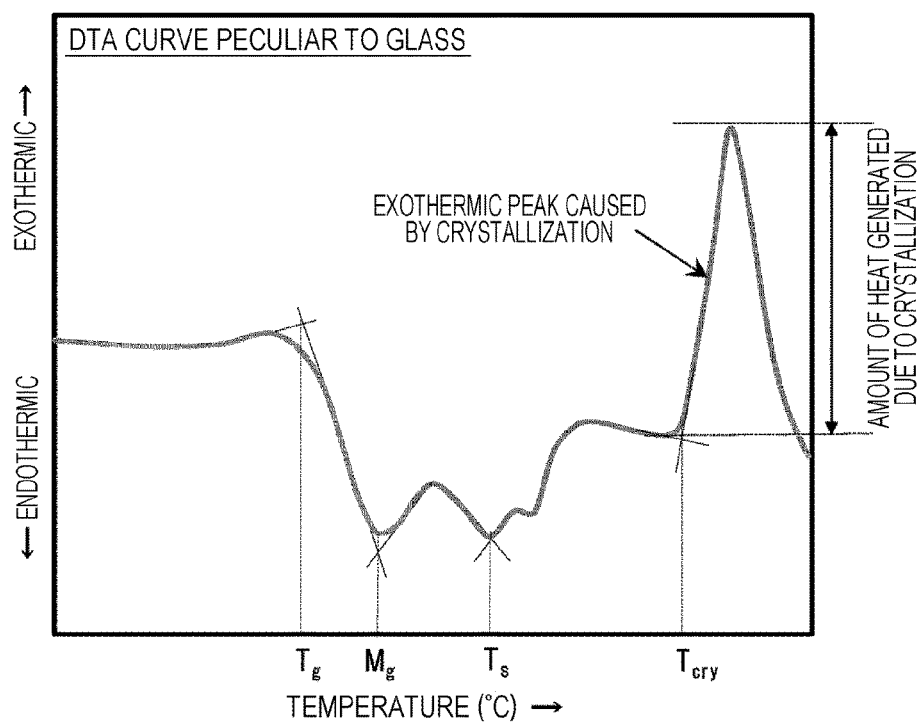
FIG. 4 illustrates an example of a typical differential thermal analysis (DTA) curve peculiar to glass.

FIG. 4 illustrates an example of a typical DTA curve peculiar to glass. In the DTA curve, the start temperature of a first endothermic peak is a transition point $T_g$, endothermic peak temperature is a yield point $M_g$, a second endothermic peak temperature is a softening point $T_s$, and the start temperature of an exothermic peak caused by crystallization is crystallization start temperature $T_{cry}$. Meanwhile, each characteristic temperature is generally obtained by using a tangent method. The characteristic temperatures, such as $T_g$, $M_g$, and $T_s$, are defined by the viscosity of glass, and $T_g$ is a temperature corresponding to $10^{13.3}$ poise, $M_g$ is a temperature corresponding to $10^{11.0}$ poise, and $T_s$ is a temperature corresponding to $10^{7.65}$ poise. The crystallization tendency is determined from $T_{cry}$ and the size of an exothermic peak caused by crystallization, that is, the amount of heat generated at the exothermic peak; and the rise of $T_{cry}$, that is, an increase in a temperature difference between $T_s$ and $T_{cry}$, and a reduction in the amount of heat generated due to crystallization mean that it is difficult for glass to be crystallized. However, generally, the lowering of $T_s$ also causes the lowering of $T_{cry}$ and tends to reduce a temperature difference between $T_s$ and $T_{cry}$.

Bonding temperature, which is obtained when die bonding members containing the low-melting glass composition are developed to a heat-dissipating structure or a semiconductor module, is affected by the type, content, and particle sizes of metal particles contained in the die bonding member, and burning conditions, such as a rate of temperature rise, atmosphere, and pressure. Generally, the bonding temperature is often set to be higher than the softening point $T_s$ by a temperature in the range of about 20 to 60° C. As the content of the metal particles is larger and the particle size of the metal particles is smaller, the bonding temperature of the die bonding member needs to be set to a higher temperature with respect to the softening point $T_s$ of the low-melting glass composition. In some cases, the bonding temperature of the die bonding member is set to a temperature higher than $T_s$ by 60° C. or more and the low-melting glass composition contained in the die bonding member is made to be sufficiently softened and flowed, so that good bondability or adhesion and compactness of the die bonding member are achieved. For this purpose, it is very important to prevent the low-melting glass composition from being crystallized at this bonding temperature. The crystallization tendency was evaluated in five stages from $T_s$, $T_{cry}$, and the amount of generated heat. When $T_s$ was 300° C. or less, that is, a low temperature and an exothermic peak caused by crystallization was not recognized up to 400° C., crystallization tendency was determined as very good "a". Further, when $T_s$ was slightly higher than 300° C. but an exothermic peak caused by crystallization was not recognized up to 400° C., crystallization tendency was determined as good "b". On the other hand, when a temperature difference between $T_s$ and $T_{cry}$ was 50° C. or more and the amount of heat generated due to crystallization was smaller than 5 µV, crystallization tendency was determined as slightly problematic "c". When a temperature difference between $T_s$ and $T_{cry}$ was lower than 50° C. or the amount of heat generated due to crystallization was 5 µV or more, crystallization tendency was determined as problematic "d". When a temperature difference between $T_s$ and $T_{cry}$ was lower than 50°

C. and the amount of heat generated due to crystallization was 5 μV or more, crystallization tendency was determined as very problematic "e".

(Evaluation of Chemical Stability)

The chemical stability of the produced lead-free low-melting glass compositions G-01 to G-77 was evaluated by a water resistance test and an acid resistance test. Table 2 illustrates the results of evaluation. Cullet, which was not yet pulverized and had a particle size in the range of about 10 to 20 mm, was used as a glass specimen. In the water resistance test, the cullet was immersed in pure water having a temperature of 50° C. for 48 hours. Further, in the acid resistance test, the cullet was immersed in a 1 N nitric acid aqueous solution at room temperature for 24 hours. The appearance of the cullet subjected to both the tests was visually observed. When a change did not appear in the appearance of the cullet, a lead-free low-melting glass composition was evaluated as "pass". On the other hand, when a change appeared in the appearance of the cullet, a lead-free low-melting glass composition was evaluated as "fail".

(Evaluation of Thermal Conductivity)

The produced lead-free low-melting glass compositions G-01 to G-77 were more finely pulverized so as to have an average particle size of 2 μm or less. Further, the density of G-01 to G-77 was in the range of about 4.5 to 6.0 g/cm³. Spherical particles having an average particle size of about 1.5 μm were used as Ag particles. 10 vol % of the powder of the lead-free low-melting glass composition and 90 vol % of the Ag particles were blended and mixed to each other, and moldings having a diameter of 10 mm and a thickness of 2 mm were produced by using a hand press. Meanwhile, pressure applied at this time was set to 500 kgf/cm². The produced moldings were heated in the air by an electric furnace up to temperatures, which are higher than the softening points $T_s$ of lead-free low-melting glass compositions by a temperature in the range of 50 to 60° C., at a rate of temperature rise of 10° C./minute and were kept for 30 minutes. As a result, sintered bodies were produced. The upper and lower surfaces of each of the produced sintered bodies were polished, and the thermal conductivity of each sintered body was measured by using a xenon flash method. Table 3 illustrates the results of measurement.

(Production of Paste for Die Bonding Member)

10 vol % of the powder of the lead-free low-melting glass composition having an average particle size of 2 μm or less and 90 vol % of spherical Ag particles having an average particle size of about 1.5 μm were blended to each other; a solvent and a viscosity modifier were added to the mixture so that the content percentage of these solid contents is in the range of 75 to 80 mass %; and the solvent, the viscosity modifier, and the mixture were mixed and kneaded well. As a result, a paste for the die bonding member was produced. In this example, α-terpineol was used as the solvent and isobornyl cyclohexanol was used as the viscosity modifier.

(Production of Bondability-Evaluation Sample)

Figure 5:
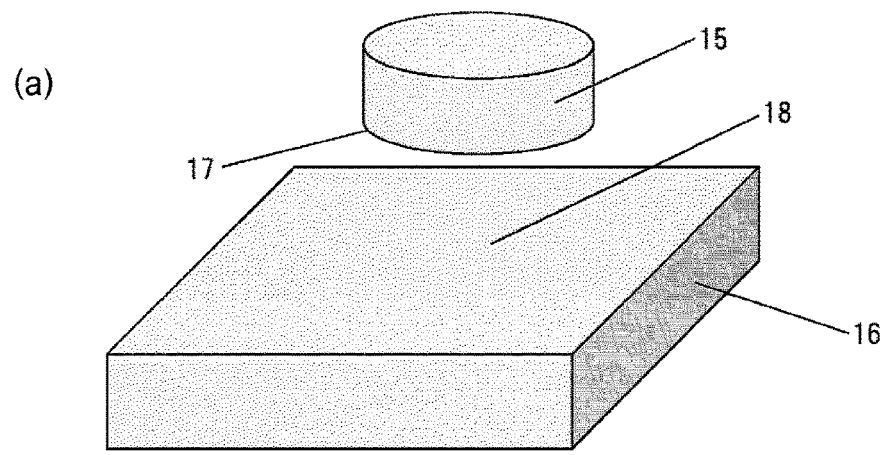
FIGS. 5(a) and 5(b) are schematic diagrams illustrating a method of producing a bondability-evaluation sample.
Figure 5:
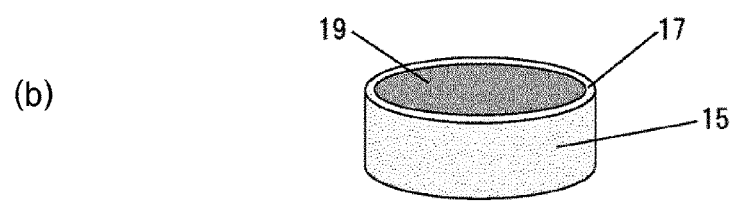
Figure 5:
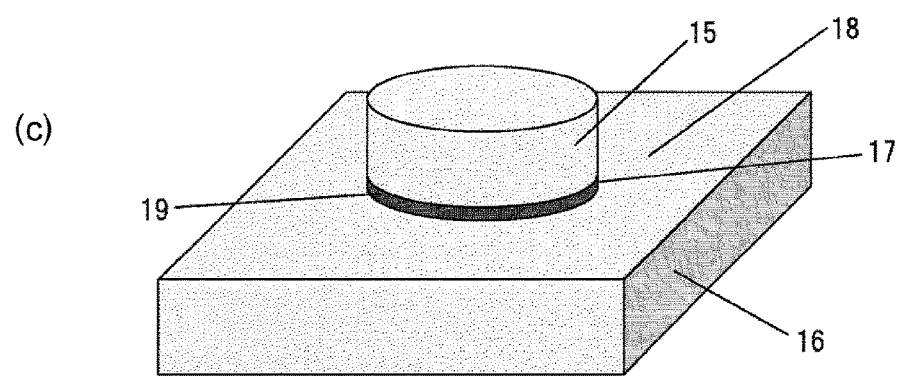

FIGS. 5(a) and 5(b) illustrate a method of producing a bondability-evaluation sample. First, a disc-shaped base material 15, which is made of metal, ceramics, or a semiconductor and has a diameter of 5 mm, and a square plate-shaped base material 16 of which one side has a length of 10 mm were prepared (a). Any of Al, Cu, Al—SiC, AlN, and Si was used as the material of each of the disc-shaped base material 15 and the square plate-shaped base material 16. Further, cases in which an Al film, a Cu film, and an Ag film are formed on bonding surfaces 17 and 18 of the base materials 15 and 16 were also examined, and the bondability of eleven types of combinations to be described below was evaluated for each lead-free low-melting glass composition. Meanwhile, in the following description, the former is the disc-shaped base material 15 and the latter is the square plate-shaped base material 16. Further, at the time of the formation of an Al film, a Cu film, and an Ag film on the bonding surfaces 17 and 18, the formation of the films was performed using spherical particles having a particle size of 45 μm or less by a low-pressure cold spray.

(1) An AlN base material and an Al—SiC base material
(2) An AlN base material on which an Al film is formed and an Al—SiC base material on which an Al film is formed
(3) An Al base material and an Al—SiC base material
(4) A Cu base material and an Al—SiC base material
(5) A Cu base material on which an Ag film is formed and an Al—SiC base material on which an Al film is formed
(6) An Al base material and an AlN base material
(7) A Cu base material and an AlN base material
(8) A Cu base material on which an Ag film is formed and an AlN base material on which an Al film is formed
(9) A Si base material on which an Al film is formed and an AlN base material on which an Al film is formed
(10) A Si base material on which an Al film is formed and an AlN base material on which a Cu film is formed
(11) A Si base material on which an Al film is formed and an AlN base material on which an Ag film is formed The paste 19 for the die bonding member, which had been produced above, was applied to the bonding surface 17 of the disc-shaped base material 15 by a dispenser method (b). After that, the disc-shaped base material 15 was dried in the air at a temperature in the range of 120 to 150° C. The bonding surface 17 and the bonding surface 18 of the square plate-shaped base material 16 were combined with each other and were fixed to a heat-resistant pressurizing jig. Pressure applied at that time was set in the range of 30 to 50 kPa. After the base materials were installed in an electric furnace, were heated in the air or in an inert gas (nitrogen) up to 220° C. at a rate of temperature rise of 10° C./minute, and were kept for 30 minutes, the base materials were heated up to a temperature, which is higher than the softening point $T_s$ of each lead-free low-melting glass composition by a temperature in the range of 50 to 60° C., at the same rate of temperature rise and were kept for 30 minutes. As a result, a joined body was produced (c). The above-mentioned (1), (2), (3), (6), (9), and (11) were heated in the air, and the above-mentioned (4), (5), (7), (8), and (10) were heated in an inert gas (nitrogen).

(Evaluation of Bondability)

The bondability of the produced joined body was evaluated by the measurement of shear stress. When shear stress was 30 MPa or more, the bondability of the produced joined body was evaluated as excellent "a". When shear stress was 20 MPa or more and was lower than 30 MPa, the bondability of the produced joined body was evaluated as good "b". When shear stress was 10 MPa or more and was lower than 20 MPa, the bondability of the produced joined body was evaluated as insufficient "c". When shear stress was lower than 10 MPa, the bondability of the produced joined body was evaluated as inadequate (Comprehensive Evaluation)

The bonding temperature, the thermal conductivity, and the bondability of a die bonding member containing a lead-free low-melting glass composition and metal particles were comprehensively evaluated. Table 3 illustrates the results of evaluation. When the bonding temperature was 300° C. or less, the thermal conductivity was 200 W/mK or more, and the shear stress was 20 MPa or more, comprehensive evaluation was evaluated as excellent "A". When the bonding temperature was higher than 300° C. but the thermal conductivity was 200 W/mK or more and the shear stress was 20 MPa or more, comprehensive evaluation was evaluated as good "B". On the other hand, when the bondability was insufficient even though the bonding temperature was low and the thermal conductivity was high, the reliability of the die bonding member was insufficient. Accordingly, when there was even one shear stress that was 10 MPa or more and lower than 20 MPa even though the bonding temperature was low and the thermal conductivity was high, comprehensive evaluation was evaluated as insufficient "C". When every shear stress was lower than 10 MPa, comprehensive evaluation was evaluated as inadequate "D".

As illustrated in Table 1, each of the lead-free low-melting glass compositions of Comparative Examples G-01 to G-04 was a ternary system of $V_2O_5$—$TeO_2$—$Ag_2O$, and each of Comparative Examples G-05 to G-19 further contained 20 mol % or less of one or more kinds of BaO, $WO_3$, and $P_2O_5$ as accessory ingredients. Each of Examples G-20 to G-71 and Comparative Examples G-72 to G-77 further contained one or more kinds of $Y_2O_3$, $La_2O_3$, and $Al_2O_3$ as additional ingredients, and the content of the additional ingredients was 2 mol % or less in the cases of Examples G-20 to G-71 and was in the range of 3 to 5 mol % in the cases of Comparative Examples G-72 to G-77.

As illustrated in Table 2, the precipitation of crystals was not recognized in any glass of G-01 to G-77, the lead-free low-melting glass compositions of G-01 to G-77 were evaluated as "pass", and the vitrified states of G-01 to G-77 were good. Further, characteristic temperatures, such as the transition point $T_g$, the yield point $M_g$, and the softening point $T_s$, of every glass were low. However, a large difference was recognized in the crystallization start temperature $T_{cry}$ and the amount of heat generated due to crystallization. It was found that the amount of heat generated due to crystallization was very large and crystallization was significant in the cases of Comparative Examples G-01 to G-04 each of which was a ternary system of $V_2O_5$—$TeO_2$—$Ag_2O$. Furthermore, since crystallization occurs before softening in the case of Comparative Example G-01, the softening point $T_s$ was not recognized in the case of Comparative Example G-01. Since Comparative Examples G-05 to G-19 contained 20 mol % or less of one or more kinds of BaO, $WO_3$, and $P_2O_5$ as accessory ingredients, the amount of generated heat thereof was significantly reduced. However, it was predicted that the crystallization was not prevented, good softening flowability was not obtained, and it was insufficient for Comparative Examples G-05 to G-19 to be developed to the die bonding member together with metal particles.

In contrast, since Examples G-20 to G-71 contained 2 mol % or less of at least one kind of $Y_2O_3$, $La_2O_3$, and $Al_2O_3$ as additional ingredients, crystallization was prevented and good softening flowability was obtained. Further, since the content of the accessory ingredients was set in the range of 3.7 to 16 mol %, $T_s$ was lowered. Furthermore, it was found that a sufficient effect of preventing crystallization was obtained when 0.2 to 1.0 mol % of additional ingredients was contained. However, when the content of the additional ingredients was larger than 2 mol %, crystallization occurs again as in the case of each of Comparative Examples G-72 to G-77 and the crystallization tendency of each of Examples G-20 to G-71 was increased with the content thereof.

As for the chemical stability of G-01 to G-77, the water resistance of every glass was good. The acid resistance of only Comparative Example G-16 was insufficient but the acid resistance of the other glass was good. The reason why the acid resistance of Comparative Example G-16 was low was that the content of $P_2O_5$ serving as an accessory ingredient was high.

From the above-mentioned examination of the composition of glass, it was found as follows: from the composition and characteristics of Examples G-20 to G-71 illustrated in Table 1 and Table 2, it was effective that the lead-free low-melting glass composition contained in the die bonding member contained $V_2O_5$, $TeO_2$, and $Ag_2O$ serving as main ingredients of which the total content was 78 mol % or more, the content of each of $TeO_2$ and $Ag_2O$ was 1 to 2 times the content of $V_2O_5$, and the lead-free low-melting glass composition further contained one or more kinds of BaO, $WO_3$, and $P_2O_5$ serving as accessory ingredients of which the total content was 20 mol % or less and one or more kinds of $Y_2O_3$, $La_2O_3$, and $Al_2O_3$ serving as additional ingredients of which the total content was 2.0 mol % or less. Moreover, it was particularly preferable that the content of the accessory ingredients of the lead-free low-melting glass composition was in the range of 3.7 to 16 mol % and the content of the additional ingredients of the lead-free low-melting glass composition was in the range of 0.2 to 1.0 mol %.

Next, the feasibility of the die bonding member, which contained 10 vol % of the lead-free low-melting glass composition and 90 vol % of Ag particles as the metal particles, was examined. When Comparative Examples G-01 to G-04, which were lead-free low-melting glass compositions as a ternary system of $V_2O_5$—$TeO_2$—$Ag_2O$, were used, the bonding temperature was in the range of 250 to 320° C. and the thermal conductivity was in the range of 117 to 152 W/mK as illustrated in Table 3. The thermal conductivity was much lower than the thermal conductivity (429 W/mK) of a bulk body made of pure silver, but was much higher than the thermal conductivity (20 to 70 W/mK) of lead-free tin-based solder or active silver solder in the related art. However, since the bondability of each of all joined bodies was very insufficient, Comparative Examples G-01 to G-04 could not be developed to the die bonding member. The reason for this is that good softening flowability was not obtained during heating and burning since the crystallization of glass of Comparative Examples G-01 to G-04 significantly occurred. In addition, since the crystallization allows the average particle size of glass to be reduced to 2 μm or less, there is a high possibility that crystallization more significantly occurs than the crystallization tendency illustrated in Table 2.

When Comparative Examples G-05 to G-19 containing one or more kinds of BaO, $WO_3$, and $P_2O_5$ as accessory ingredients, were used, the bonding temperature was in the range of 270 to 350° C. and the thermal conductivity was in the range of 151 to 188 W/mK. The thermal conductivity tended to be high in comparison with the cases of Comparative Examples G-01 to G-04. This is the result of the implication of the fact that the crystallization tendency was suppressed, even if only slightly, by the containing of one or more kinds of BaO, $WO_3$, and $P_2O_5$. However, some improvement of the bondability of each joined body was recognized in the cases of Comparative Examples G-07, G-11, G-13 to G-16, and G-19, but was insufficient. The other Comparative Examples G-05, G-06, G-08 to G-10, G-12, G-17, and G-18 were inadequate as in the cases of Comparative Examples G-01 to G-04. From the examination of a relation between thermal conductivity and bondability in Comparative Examples G-01 to G-19, it was found that thermal conductivity was high, that is, in the range of 170 to 188 W/mK when Comparative Examples G-07, G-11, G-13 to G-16, and G-19 in which the tendency of improvement of bondability was recognized were used. Accordingly, when good softening flowability was obtained by the prevention of the crystallization of the $V_2O_5$—$TeO_2$—$Ag_2O$-based lead-free low-melting glass composition, it was expected and found that both the heat dissipation property and bondability of the die bonding member could be improved.

When Examples G-20 to G-71, which contained one or more kinds of $Y_2O_3$, $La_2O_3$, and $Al_2O_3$ serving as additional ingredients in addition to the accessory ingredients and in which crystallization was prevented, were used, the bonding temperature was high, that is, in the range of 270 to 370° C. and the thermal conductivity was high, that is, in the range of 220 to 246 W/mK. Further, since shear stress of 20 MPa or more was obtained in every joined body of (1) to (11), bondability was good. Particularly, very high shear stress of 30 MPa or more was achieved in each of the joined bodies (2), (5), (8), (9), and (11) where an Al film or an Ag film was formed on the bonding surface. In comparison with the above-mentioned Comparative Examples G-01 to G-19, good softening flowability was achieved by the prevention of crystallization in Examples G-20 to G-71. Accordingly, thermal conductivity, that is, a heat dissipation property was further improved and bondability was also significantly improved. Particularly, when Examples G-23 to G-28, G-34 to G-36, G-39, G-41 to G-43, G-50, G-51, and G-54 to G-58 were used, bonding at a low temperature of 300° C. or less, that is, die bonding at a low temperature could be performed. The reason why thermal conductivity was improved when Examples G-20 to G-71 were used was that necking between Ag particles used as metal particles was promoted by the softening and flowing of glass. The Examples G-20 to G-71 had good wettability to the Al film or the Ag film formed on the bonding surface when glass was softened and flowed by heating. Furthermore, the glass reacted appropriately with these films, so that a compound of glass components and the films was formed on a bonding interface. When the Al film was used, the oxide film formed on the surface was removed by the reaction with the glass. Accordingly, it was thought that strong adhesion or bonding could be achieved. The film is not limited to a film made of pure Al or pure Ag, and it goes without saying that the same effect can be expected even though the film was a film made of an Al alloy or an Ag alloy.

However, when the content of the additional ingredients is large, crystallization occurs again as illustrated in Table 2 and softening flowability deteriorates. For this reason, when Comparative Examples G-72 to G-77 were used, the bonding temperature was in the range of 310 to 320° C. and the thermal conductivity was lowered to the range of 168 to 201 W/mK. In addition, the bondability of every joined body deteriorated and the shear stress thereof was lower than 20 MPa.

From Tables 1 to 3 described above, it was effective that the lead-free low-melting glass composition, which was contained in the die bonding member having a high heat dissipation property and high bondability together with metal particles, contained $V_2O_5$, $TeO_2$, and $Ag_2O$ as main ingredients of which the total content was 78 mol % or more, the content of each of $TeO_2$ and $Ag_2O$ was 1 to 2 times the content of $V_2O_5$, and the lead-free low-melting glass composition further contained one or more kinds of BaO, $WO_3$, and $P_2O_5$ serving as accessory ingredients of which the total content was 20 mol % or less and one or more kinds of $Y_2O_3$, $La_2O_3$, and $Al_2O_3$ serving as additional ingredients of which the total content was 2.0 mol % or less. Particularly, it was preferable that the content of the accessory ingredients was in the range of 3.7 to 16 mol % and the content of the additional ingredients was in the range of 0.2 to 1.0 mol %. The die bonding member containing the lead-free low-melting glass composition could be effectively developed to a heat-dissipating structure or a semiconductor module. Further, when an Al film, an Ag film, an Al alloy film, or an Ag alloy film were formed on the bonding surface of the heat-dissipating structure or the semiconductor module, stronger bonding could be achieved.

TABLE 1

|  | GLASS | MAIN INGREDIENT (mol %) | | | ACCESSORY INGREDIENT (mol %) | | | ADDITIONAL INGREDIENT (mol %) | | |
| --- | --- | --- | --- | --- | --- | --- | --- | --- | --- | --- |
|  | No. | $V_2O_5$ | $TeO_2$ | $Ag_2O$ | BaO | $WO_3$ | $P_2O_5$ | $Y_2O_3$ | $La_2O_3$ | $Al_2O_3$ |
| COMPARATIVE EXAMPLE | G-01 | 40.0 | 40.0 | 20.0 | — | — | — | — | — | — |
|  | G-02 | 21.0 | 42.0 | 37.0 | — | — | — | — | — | — |
|  | G-03 | 20.0 | 40.0 | 40.0 | — | — | — | — | — | — |
|  | G-04 | 18.0 | 47.0 | 35.0 | — | — | — | — | — | — |
|  | G-05 | 21.0 | 38.0 | 38.0 | 3.0 | 1.0 | — | — | — | — |
|  | G-06 | 20.0 | 39.0 | 36.0 | 5.0 | — | — | — | — | — |
|  | G-07 | 20.0 | 39.0 | 36.0 | — | 5.0 | — | — | — | — |
|  | G-08 | 21.5 | 36.5 | 33.5 | — | 8.5 | — | — | — | — |
|  | G-09 | 20.0 | 40.0 | 30.0 | 10.0 | — | — | — | — | — |
|  | G-10 | 20.0 | 30.0 | 40.0 | — | 10.0 | — | — | — | — |
|  | G-11 | 20.0 | 40.0 | 30.0 | — | 10.0 | — | — | — | — |
|  | G-12 | 20.0 | 37.0 | 33.0 | 5.0 | 5.0 | — | — | — | — |
|  | G-13 | 20.0 | 40.0 | 30.0 | 5.0 | 5.0 | — | — | — | — |
|  | G-14 | 30.0 | 30.0 | 30.0 | 5.0 | — | 5.0 | — | — | — |
|  | G-15 | 20.0 | 38.0 | 30.0 | 5.0 | 7.0 | — | — | — | — |
|  | G-16 | 20.0 | 35.0 | 32.0 | — | — | 13.0 | — | — | — |
|  | G-17 | 30.0 | 34.0 | 20.0 | 6.0 | 4.0 | 6.0 | — | — | — |
|  | G-18 | 17.0 | 35.0 | 32.0 | 6.0 | 4.0 | 6.0 | — | — | — |
|  | G-19 | 20.0 | 35.0 | 25.0 | 6.0 | 8.0 | 6.0 | — | — | — |
| EXAMPLE | G-20 | 20.0 | 34.8 | 29.0 | 6.0 | 6.0 | 5.0 | 0.2 | — | — |
|  | G-21 | 20.0 | 35.8 | 28.0 | 6.0 | 6.0 | 4.0 | — | 0.2 | — |
|  | G-22 | 25.0 | 34.8 | 25.0 | 6.0 | 4.0 | 8.0 | — | — | 0.2 |
|  | G-23 | 21.0 | 38.0 | 38.0 | 3.0 | 0.7 | — | 0.3 | — | — |
|  | G-24 | 21.0 | 38.0 | 38.0 | 3.0 | 0.7 | — | — | 0.3 | — |
|  | G-25 | 21.0 | 38.0 | 38.0 | 3.0 | 0.7 | — | — | — | 0.3 |

TABLE 1-continued

| | GLASS No. | MAIN INGREDIENT (mol %) | | | ACCESSORY INGREDIENT (mol %) | | | ADDITIONAL INGREDIENT (mol %) | | |
|---|---|---|---|---|---|---|---|---|---|---|
| | | $V_2O_5$ | $TeO_2$ | $Ag_2O$ | BaO | $WO_3$ | $P_2O_5$ | $Y_2O_3$ | $La_2O_3$ | $Al_2O_3$ |
| | G-26 | 20.0 | 38.0 | 36.0 | 5.0 | 0.7 | — | 0.3 | — | — |
| | G-27 | 20.0 | 38.0 | 36.0 | 5.0 | 0.7 | — | — | 0.3 | — |
| | G-28 | 20.0 | 38.0 | 36.0 | 5.0 | 0.7 | — | — | — | 03 |
| | G-29 | 23.7 | 34.0 | 24.0 | 9.0 | — | 9.0 | — | — | 0.3 |
| | G-30 | 20.0 | 36.5 | 30.0 | 6.0 | 5.0 | 3.0 | 0.5 | — | — |
| | G-31 | 20.0 | 40.0 | 26.5 | 13.0 | — | — | 0.5 | — | — |
| | G-32 | 20.0 | 36.5 | 30.0 | 3.0 | 7.0 | 3.0 | 0.5 | — | — |
| | G-33 | 20.0 | 39.5 | 30.0 | 5.0 | 5.0 | — | — | 0.5 | — |
| | G-34 | 20.0 | 37.5 | 35.0 | 5.0 | 2.0 | — | — | 0.5 | — |
| | G-35 | 20.0 | 36.5 | 33.0 | 5.0 | 5.0 | — | — | 0.5 | — |
| | G-36 | 20.0 | 37.5 | 35.0 | 5.0 | — | 2.0 | — | 0.5 | — |
| | G-37 | 27.0 | 35.0 | 27.0 | — | 4.0 | 6.5 | — | 0.5 | — |
| | G-38 | 19.0 | 37.5 | 33.0 | 4.0 | 4.0 | 2.0 | — | 0.5 | — |
| | G-39 | 20.0 | 38.5 | 36.0 | 5.0 | — | — | — | — | 0.5 |
| | G-40 | 20.0 | 39.5 | 30.0 | 5.0 | 6.0 | — | — | — | 0.5 |
| | G-41 | 20.0 | 37.5 | 35.0 | 5.0 | 2.0 | — | — | — | 0.5 |
| | G-42 | 20.0 | 36.5 | 33.0 | 5.0 | 5.0 | — | — | — | 0.5 |
| | G-43 | 20.0 | 37.5 | 35.0 | 5.0 | — | 2.0 | — | — | 0.5 |
| | G-44 | 27.0 | 35.0 | 27.0 | — | 4.0 | 6.5 | — | — | 0.5 |
| | G-45 | 19.0 | 37.5 | 33.0 | 4.0 | 4.0 | 2.0 | — | — | 0.5 |
| | G-46 | 20.0 | 35.0 | 30.0 | 5.0 | 5.0 | 4.4 | 0.3 | 0.3 | — |
| | G-47 | 20.0 | 35.0 | 30.0 | 5.0 | 5.0 | 4.4 | — | 0.3 | 0.3 |
| | G-48 | 20.0 | 35.0 | 30.0 | 5.0 | 5.0 | 4.4 | 0.3 | — | 0.3 |
| | G-49 | 20.0 | 35.0 | 30.0 | 5.0 | 5.0 | 4.1 | 0.3 | 0.3 | 0.3 |
| | G-50 | 20.0 | 36.0 | 32.0 | 6.0 | 5.0 | — | 1.0 | — | — |
| | G-51 | 20.0 | 36.0 | 32.0 | 6.0 | 5.0 | — | — | 1.0 | — |
| | G-52 | 20.0 | 38.0 | 28.0 | 5.0 | 8.0 | — | — | 1.0 | — |
| | G-53 | 25.5 | 35.0 | 25.5 | — | 8.0 | 5.0 | — | 1.0 | — |
| | G-54 | 20.0 | 40.0 | 29.0 | 5.0 | 5.0 | — | 0.5 | 0.5 | — |
| | G-55 | 20.0 | 36.0 | 33.0 | 5.0 | 5.0 | — | 0.5 | 0.5 | — |
| | G-56 | 20.0 | 38.5 | 35.5 | 5.0 | — | — | — | — | 1.0 |
| | G-57 | 20.0 | 38.5 | 35.5 | — | — | 5.0 | — | — | 1.0 |
| | G-58 | 20.0 | 36.0 | 32.0 | 6.0 | 5.0 | — | — | — | 1.0 |
| | G-59 | 20.0 | 38.0 | 28.0 | 5.0 | 8.0 | — | — | — | 1.0 |
| | G-60 | 25.5 | 35.0 | 25.5 | — | 8.0 | 5.0 | — | — | 1.0 |
| | G-61 | 18.5 | 35.0 | 30.0 | 5.0 | 5.0 | 5.0 | 0.5 | 0.5 | 0.5 |
| | G-62 | 19.0 | 34.5 | 25.0 | 6.0 | 7.0 | 7.0 | 0.5 | 0.5 | 0.5 |
| | G-63 | 19.0 | 35.0 | 29.0 | 5.0 | 5.0 | 5.0 | 2.0 | — | — |
| | G-64 | 18.5 | 34.5 | 25.0 | 7.0 | 6.0 | 7.0 | 2.0 | — | — |
| | G-65 | 19.0 | 35.0 | 29.0 | 5.0 | 5.0 | 5.0 | — | 2.0 | — |
| | G-66 | 18.5 | 34.5 | 25.0 | 7.0 | 6.0 | 7.0 | — | 2.0 | — |
| | G-67 | 19.0 | 35.0 | 29.0 | 5.0 | 5.0 | 6.0 | — | — | 2.0 |
| | G-68 | 18.5 | 34.5 | 25.0 | 7.0 | 6.0 | 7.0 | — | — | 2.0 |
| | G-69 | 19.0 | 35.0 | 29.0 | 5.0 | 5.0 | 5.0 | 1.0 | 1.0 | — |
| | G-70 | 19.0 | 35.0 | 29.0 | 5.0 | 5.0 | 5.0 | — | 1.0 | 1.0 |
| | G-71 | 19.0 | 35.0 | 29.0 | 5.0 | 5.0 | 5.0 | 1.0 | — | 1.0 |
| COMPARATIVE EXAMPLE | G-72 | 20.0 | 37.0 | 30.0 | 5.0 | 5.0 | — | 3.0 | — | — |
| | G-73 | 20.0 | 37.0 | 30.0 | 5.0 | 5.0 | — | — | 3.0 | — |
| | G-74 | 20.0 | 37.0 | 30.0 | 5.0 | 5.0 | — | — | — | 3.0 |
| | G-75 | 20.0 | 37.0 | 28.0 | 5.0 | 5.0 | — | 5.0 | — | — |
| | G-76 | 20.0 | 37.0 | 28.0 | 5.0 | 5.0 | — | — | 5.0 | — |
| | G-77 | 20.0 | 37.0 | 28.0 | 5.0 | 5.0 | — | — | — | 5.0 |

TABLE 2

| | GLASS No. | VITRIFIED STATE | CHARACTERISTIC TEMPERATURE (° C.) | | | | AMOUNT OF HEAT GENERATED DUE TO CRYSTALLIZATION (μV) | EVALUATION OF CRYSTALLIZATION TENDENCY | CHEMICAL STABILITY | |
|---|---|---|---|---|---|---|---|---|---|---|
| | | | TRANSITION POINT $T_g$ | YIELD POINT $M_g$ | SOFTENING POINT $T_s$ | CRYSTALLIZATION START TEMPERATURE $T_{cry}$ | | | WATER RESISTANCE TEST | ACID RESISTANCE TEST |
| COMPARATIVE EXAMPLE | G-01 | PASS | 212 | 224 | — | 261 | 125 | e | PASS | PASS |
| | G-02 | PASS | 163 | 172 | 208 | 263 | 160 | d | PASS | PASS |
| | G-03 | PASS | 153 | 168 | 196 | 260 | 150 | d | PASS | PASS |
| | G-04 | PASS | 169 | 180 | 213 | 255 | 175 | e | PASS | PASS |
| | G-05 | PASS | 167 | 182 | 216 | 260 | 12 | e | PASS | PASS |
| | G-06 | PASS | 167 | 180 | 218 | 258 | 33 | e | PASS | PASS |

TABLE 2-continued

| | GLASS No. | VITRIFIED STATE | CHARACTERISTIC TEMPERATURE (°C.) | | | | AMOUNT OF HEAT GENERATED DUE TO CRYSTAL-LIZATION ($\mu V$) | EVALUATION OF CRYSTAL-LIZATION TENDENCY | CHEMICAL STABILITY | |
|---|---|---|---|---|---|---|---|---|---|---|
| | | | TRANSITION POINT $T_g$ | YIELD POINT $M_g$ | SOFTENING POINT $T_s$ | CRYSTAL-LIZATION START TEMPER-ATURE $T_{cry}$ | | | WATER RESIS-TANCE TEST | ACID RESIS-TANCE TEST |
| | G-07 | PASS | 175 | 184 | 225 | 283 | 12 | d | PASS | PASS |
| | G-08 | PASS | 185 | 200 | 233 | 270 | 67 | e | PASS | PASS |
| | G-09 | PASS | 172 | 204 | 238 | 263 | 19 | d | PASS | PASS |
| | G-10 | PASS | 206 | 228 | 263 | 315 | 35 | d | PASS | PASS |
| | G-11 | PASS | 201 | 221 | 258 | 322 | 29 | d | PASS | PASS |
| | G-12 | PASS | 186 | 203 | 236 | 285 | 26 | e | PASS | PASS |
| | G-13 | PASS | 191 | 208 | 242 | 305 | 14 | d | PASS | PASS |
| | G-14 | PASS | 224 | 247 | 284 | 337 | 7 | d | PASS | PASS |
| | G-15 | PASS | 192 | 218 | 256 | 337 | 8 | d | PASS | PASS |
| | G-16 | PASS | 222 | 241 | 276 | 341 | 5 | d | PASS | FAIL |
| | G-17 | PASS | 236 | 262 | 297 | 336 | 18 | e | PASS | PASS |
| | G-18 | PASS | 200 | 211 | 262 | 284 | 21 | e | PASS | PASS |
| | G-19 | PASS | 233 | 253 | 295 | 345 | 6 | d | PASS | PASS |
| EXAMPLE | G-20 | PASS | 207 | 221 | 257 | THERE IS NO EXOTHERMIC PEAK | 0 | a | PASS | PASS |
| | G-21 | PASS | 212 | 232 | 268 | THERE IS NO EXOTHERMIC PEAK | 0 | a | PASS | PASS |
| | G-22 | PASS | 223 | 245 | 285 | THERE IS NO EXOTHERMIC PEAK | 0 | a | PASS | PASS |
| | G-23 | PASS | 165 | 183 | 219 | THERE IS NO EXOTHERMIC PEAK | 0 | a | PASS | PASS |
| | G-24 | PASS | 165 | 186 | 217 | THERE IS NO EXOTHERMIC PEAK | 0 | a | PASS | PASS |
| | G-25 | PASS | 168 | 184 | 220 | THERE IS NO EXOTHERMIC PEAK | 0 | a | PASS | PASS |
| | G-26 | PASS | 169 | 186 | 222 | THERE IS NO EXOTHERMIC PEAK | 0 | a | PASS | PASS |
| | G-27 | PASS | 168 | 189 | 220 | THERE IS NO EXOTHERMIC PEAK | 0 | a | PASS | PASS |
| | G-28 | PASS | 173 | 188 | 227 | THERE IS NO EXOTHERMIC PEAK | 0 | a | PASS | PASS |
| | G-29 | PASS | 228 | 251 | 295 | THERE IS NO EXOTHERMIC PEAK | 0 | a | PASS | PASS |
| | G-30 | PASS | 220 | 244 | 280 | THERE IS NO EXOTHERMIC PEAK | 0 | a | PASS | PASS |
| | G-31 | PASS | 210 | 243 | 279 | THERE IS NO EXOTHERMIC PEAK | 0 | a | PASS | PASS |
| | G-32 | PASS | 221 | 241 | 278 | THERE IS NO EXOTHERMIC PEAK | 0 | a | PASS | PASS |
| | G-33 | PASS | 195 | 212 | 251 | THERE IS NO EXOTHERMIC PEAK | 0 | a | PASS | PASS |
| | G-34 | PASS | 174 | 196 | 231 | THERE IS NO EXOTHERMIC PEAK | 0 | a | PASS | PASS |
| | G-35 | PASS | 184 | 203 | 239 | THERE IS NO EXOTHERMIC PEAK | 0 | a | PASS | PASS |
| | G-36 | PASS | 176 | 202 | 240 | THERE IS NO EXOTHERMIC PEAK | 0 | a | PASS | PASS |
| | G-37 | PASS | 220 | 236 | 274 | THERE IS NO EXOTHERMIC PEAK | 0 | a | PASS | PASS |
| | G-38 | PASS | 197 | 214 | 260 | THERE IS NO EXOTHERMIC PEAK | 0 | a | PASS | PASS |

TABLE 2-continued

| GLASS No. | VITRIFIED STATE | CHARACTERISTIC TEMPERATURE (° C.) | | | | AMOUNT OF HEAT GENERATED DUE TO CRYSTAL-LIZATION ($\mu$V) | EVALUATION OF CRYSTAL-LIZATION TENDENCY | CHEMICAL STABILITY | |
|---|---|---|---|---|---|---|---|---|---|
| | | TRANSITION POINT $T_g$ | YIELD POINT $M_g$ | SOFTENING POINT $T_s$ | CRYSTAL-LIZATION START TEMPER-ATURE $T_{cry}$ | | | WATER RESIS-TANCE TEST | ACID RESIS-TANCE TEST |
| G-39 | PASS | 172 | 182 | 224 | THERE IS NO EXOTHERMIC PEAK | 0 | a | PASS | PASS |
| G-40 | PASS | 193 | 215 | 255 | THERE IS NO EXOTHERMIC PEAK | 0 | a | PASS | PASS |
| G-41 | PASS | 177 | 195 | 235 | THERE IS NO EXOTHERMIC PEAK | 0 | a | PASS | PASS |
| G-42 | PASS | 189 | 205 | 244 | THERE IS NO EXOTHERMIC PEAK | 0 | a | PASS | PASS |
| G-43 | PASS | 179 | 199 | 240 | THERE IS NO EXOTHERMIC PEAK | 0 | a | PASS | PASS |
| G-44 | PASS | 223 | 234 | 277 | THERE IS NO EXOTHERMIC PEAK | 0 | a | PASS | PASS |
| G-45 | PASS | 200 | 212 | 263 | THERE IS NO EXOTHERMIC PEAK | 0 | a | PASS | PASS |
| G-46 | PASS | 223 | 245 | 284 | THERE IS NO EXOTHERMIC PEAK | 0 | a | PASS | PASS |
| G-47 | PASS | 222 | 246 | 287 | THERE IS NO EXOTHERMIC PEAK | 0 | a | PASS | PASS |
| G-48 | PASS | 220 | 244 | 286 | THERE IS NO EXOTHERMIC PEAK | 0 | a | PASS | PASS |
| G-49 | PASS | 217 | 240 | 282 | THERE IS NO EXOTHERMIC PEAK | 0 | a | PASS | PASS |
| G-50 | PASS | 193 | 210 | 250 | THERE IS NO EXOTHERMIC PEAK | 0 | a | PASS | PASS |
| G-51 | PASS | 190 | 212 | 247 | THERE IS NO EXOTHERMIC PEAK | 0 | a | PASS | PASS |
| G-52 | PASS | 223 | 240 | 280 | THERE IS NO EXOTHERMIC PEAK | 0 | a | PASS | PASS |
| G-53 | PASS | 225 | 243 | 280 | THERE IS NO EXOTHERMIC PEAK | 0 | a | PASS | PASS |
| G-54 | PASS | 194 | 215 | 260 | THERE IS NO EXOTHERMIC PEAK | 0 | a | PASS | PASS |
| G-55 | PASS | 187 | 207 | 245 | THERE IS NO EXOTHERMIC PEAK | 0 | a | PASS | PASS |
| G-56 | PASS | 171 | 191 | 230 | THERE IS NO EXOTHERMIC PEAK | 0 | a | PASS | PASS |
| G-57 | PASS | 174 | 192 | 237 | THERE IS NO EXOTHERMIC PEAK | 0 | a | PASS | PASS |
| G-58 | PASS | 195 | 214 | 249 | THERE IS NO EXOTHERMIC PEAK | 0 | a | PASS | PASS |
| G-59 | PASS | 226 | 238 | 280 | THERE IS NO EXOTHERMIC PEAK | 0 | a | PASS | PASS |
| G-60 | PASS | 228 | 241 | 280 | THERE IS NO EXOTHERMIC PEAK | 0 | a | PASS | PASS |
| G-61 | PASS | 225 | 249 | 291 | THERE IS NO EXOTHERMIC PEAK | 0 | a | PASS | PASS |

TABLE 2-continued

| | GLASS No. | VITRIFIED STATE | CHARACTERISTIC TEMPERATURE (° C.) | | | | AMOUNT OF HEAT GENERATED DUE TO CRYSTAL-LIZATION ($\mu$V) | EVALUATION OF CRYSTAL-LIZATION TENDENCY | CHEMICAL STABILITY | |
|---|---|---|---|---|---|---|---|---|---|---|
| | | | TRANSITION POINT $T_g$ | YIELD POINT $M_g$ | SOFTENING POINT $T_s$ | CRYSTAL-LIZATION START TEMPER-ATURE $T_{cry}$ | | | WATER RESIS-TANCE TEST | ACID RESIS-TANCE TEST |
| | G-62 | PASS | 243 | 266 | 308 | THERE IS NO EXOTHERMIC PEAK | 0 | b | PASS | PASS |
| | G-63 | PASS | 230 | 255 | 297 | THERE IS NO EXOTHERMIC PEAK | 0 | a | PASS | PASS |
| | G-64 | PASS | 245 | 272 | 315 | THERE IS NO EXOTHERMIC PEAK | 0 | b | PASS | PASS |
| | G-65 | PASS | 231 | 250 | 294 | THERE IS NO EXOTHERMIC PEAK | 0 | a | PASS | PASS |
| | G-66 | PASS | 243 | 270 | 312 | THERE IS NO EXOTHERMIC PEAK | 0 | b | PASS | PASS |
| | G-67 | PASS | 235 | 248 | 298 | THERE IS NO EXOTHERMIC PEAK | 0 | a | PASS | PASS |
| | G-68 | PASS | 245 | 277 | 318 | THERE IS NO EXOTHERMIC PEAK | 0 | b | PASS | PASS |
| | G-69 | PASS | 226 | 253 | 295 | THERE IS NO EXOTHERMIC PEAK | 0 | a | PASS | PASS |
| | G-70 | PASS | 223 | 251 | 296 | THERE IS NO EXOTHERMIC PEAK | 0 | a | PASS | PASS |
| | G-71 | PASS | 225 | 253 | 295 | THERE IS NO EXOTHERMIC PEAK | 0 | a | PASS | PASS |
| COMPAR-ATIVE EXAMPLE | G-72 | PASS | 196 | 210 | 255 | 306 | 3 | c | PASS | PASS |
| | G-73 | PASS | 198 | 213 | 251 | 310 | 2 | c | PASS | PASS |
| | G-74 | PASS | 201 | 211 | 254 | 315 | 3 | c | PASS | PASS |
| | G-75 | PASS | 205 | 225 | 260 | 284 | 9 | e | PASS | PASS |
| | G-76 | PASS | 204 | 223 | 262 | 290 | 7 | e | PASS | PASS |
| | G-77 | PASS | 207 | 221 | 265 | 295 | 6 | e | PASS | PASS |

TABLE 3

| | GLASS No. | BONDING TEMPER-ATURE (° C.) | THERMAL CONDUC-TIVITY (W/mk) | RESULTS OF EVALUATION OF BONDABILITY | | | | | | | | | | | |
|---|---|---|---|---|---|---|---|---|---|---|---|---|---|---|---|
| | | | | (1) AlN Al-SiC | (2) AlN/Al FILM Al-SiC | (3) Al FILM/Al-SiC | (4) Cu Al-SiC | (5) Cu/Aq FILM Al-SiC | (6) Al AlN | (7) Cu AlN | (8) Cu/Aq FILM Al FILM/AlN | (9) Si/Al FILM Al FILM/AlN | (10) Si/Al FILM Cu FILM/AlN | (11) Si/Al FILM Ag FILM/AlN | COMPRE-HENSIVE EVAL-UATION |
| COMPAR-ATIVE EXAMPLE | G-01 | 320 | 117 | d | d | d | d | d | d | d | d | d | d | d | D |
| | G-02 | 260 | 144 | d | d | d | d | d | d | d | d | d | d | d | D |
| | G-03 | 250 | 152 | d | d | d | d | d | d | d | d | d | d | d | D |
| | G-04 | 270 | 145 | d | d | d | d | d | d | d | d | d | d | d | D |
| | G-05 | 270 | 162 | d | d | d | d | d | d | d | d | d | d | d | D |
| | G-06 | 270 | 157 | d | d | d | d | d | d | d | d | d | d | d | D |
| | G-07 | 280 | 170 | d | c | d | d | c | d | d | c | c | d | c | C |
| | G-08 | 290 | 146 | d | d | d | d | d | d | d | d | d | d | d | D |
| | G-09 | 290 | 152 | d | d | d | d | d | d | d | d | d | d | d | D |
| | G-10 | 320 | 151 | d | d | d | d | d | d | d | d | d | d | d | D |
| | G-11 | 310 | 172 | d | c | d | d | c | d | d | c | c | d | c | C |
| | G-12 | 290 | 162 | d | d | d | d | d | d | d | d | d | d | d | D |
| | G-13 | 300 | 177 | d | c | d | d | c | d | d | c | c | d | c | C |
| | G-14 | 340 | 181 | d | c | d | d | c | d | d | c | c | d | c | C |
| | G-15 | 310 | 188 | c | c | c | c | c | c | c | c | c | c | c | C |
| | G-16 | 330 | 178 | c | c | c | c | c | c | c | c | c | c | c | C |
| | G-17 | 350 | 160 | d | d | d | d | d | d | d | d | d | d | d | D |

TABLE 3-continued

| | GLASS No. | BONDING TEMPER- ATURE (° C.) | THERMAL CONDUC- TIVITY (W/mk) | (1) AlN Al- SiC | (2) AlN/ Al FILM Al FILM/ Al- SiC | (3) Al Al- SiC | (4) Cu Al- SiC | (5) Cu/Aq FILM Al FILM/ Al- SiC | (6) Al AlN | (7) Cu AlN | (8) Cu/Aq FILM Al FILM/ AlN | (9) Si/Al FILM Al FILM/ AlN | (10) Si/Al FILM Cu FILM/ AlN | (11) Si/Al FILM Ag FILM/ AlN | COMPRE- HENSIVE EVAL- UATION |
|---|---|---|---|---|---|---|---|---|---|---|---|---|---|---|---|
| | G-18 | 320 | 163 | d | d | d | d | d | d | d | d | d | d | d | D |
| | G-19 | 350 | 183 | d | c | d | d | c | d | d | c | c | d | c | C |
| EXAMPLE | G-20 | 310 | 222 | b | a | b | b | a | b | b | a | a | b | a | B |
| | G-21 | 320 | 225 | b | a | b | b | a | b | b | a | a | b | a | B |
| | G-22 | 340 | 220 | b | a | b | b | a | b | b | a | a | b | a | B |
| | G-23 | 270 | 238 | b | a | b | b | a | b | b | a | a | b | a | A |
| | G-24 | 270 | 234 | b | a | b | b | a | b | b | a | a | b | a | A |
| | G-25 | 270 | 236 | b | a | b | b | a | b | b | a | a | b | a | A |
| | G-26 | 280 | 240 | b | a | b | b | a | b | b | a | a | b | a | A |
| | G-27 | 270 | 236 | b | a | b | b | a | b | b | a | a | b | a | A |
| | G-28 | 280 | 232 | b | a | b | b | a | b | b | a | a | b | a | A |
| | G-29 | 350 | 224 | b | a | b | b | a | b | b | a | a | b | a | B |
| | G-30 | 330 | 243 | b | a | b | b | a | b | b | a | a | b | a | B |
| | G-31 | 330 | 230 | b | a | b | b | a | b | b | a | a | b | a | B |
| | G-32 | 330 | 245 | b | a | b | b | a | b | b | a | a | b | a | B |
| | G-33 | 310 | 237 | b | a | b | b | a | b | b | a | a | b | a | B |
| | G-34 | 290 | 246 | b | a | b | b | a | b | b | a | a | b | a | A |
| | G-35 | 290 | 244 | b | a | b | b | a | b | b | a | a | b | a | A |
| | G-36 | 290 | 234 | b | a | b | b | a | b | b | a | a | b | a | A |
| | G-37 | 330 | 229 | b | a | b | b | a | b | b | a | a | b | a | B |
| | G-38 | 310 | 239 | b | a | b | b | a | b | b | a | a | b | a | B |
| | G-39 | 280 | 226 | b | a | b | b | a | b | b | a | a | b | a | A |
| | G-40 | 310 | 235 | b | a | b | b | a | b | b | a | a | b | a | B |
| | G-41 | 290 | 237 | b | a | b | b | a | b | b | a | a | b | a | A |
| | G-42 | 300 | 242 | b | a | b | b | a | b | b | a | a | b | a | A |
| | G-43 | 290 | 239 | b | a | b | b | a | b | b | a | a | b | a | A |
| | G-44 | 330 | 222 | b | a | b | b | a | b | b | a | a | b | a | B |
| | G-45 | 320 | 235 | b | a | b | b | a | b | b | a | a | b | a | B |
| | G-46 | 340 | 238 | b | a | b | b | a | b | b | a | a | b | a | B |
| | G-47 | 340 | 230 | b | a | b | b | a | b | b | a | a | b | a | B |
| | G-48 | 340 | 227 | b | a | b | b | a | b | b | a | a | b | a | B |
| | G-49 | 340 | 225 | b | a | b | b | a | b | b | a | a | b | a | B |
| | G-50 | 340 | 231 | b | a | b | b | a | b | b | a | a | b | a | A |
| | G-51 | 300 | 235 | b | a | b | b | a | b | b | a | a | b | a | A |
| | G-52 | 330 | 226 | b | a | b | b | a | b | b | a | a | b | a | B |
| | G-53 | 330 | 220 | b | a | b | b | a | b | b | a | a | b | a | B |
| | G-54 | 300 | 233 | b | a | b | b | a | b | b | a | a | b | a | A |
| | G-55 | 300 | 237 | b | a | b | b | a | b | b | a | a | b | a | A |
| | G-56 | 280 | 229 | b | a | b | b | a | b | b | a | a | b | a | A |
| | G-57 | 290 | 222 | b | a | b | b | a | b | b | a | a | b | a | A |
| | G-58 | 300 | 230 | b | a | b | b | a | b | b | a | a | b | a | A |
| | G-59 | 330 | 221 | b | a | b | b | a | b | b | a | a | b | a | B |
| | G-60 | 330 | 221 | b | a | b | b | a | b | b | a | a | b | a | B |
| | G-61 | 350 | 230 | b | a | b | b | a | b | b | a | a | b | a | B |
| | G-62 | 360 | 223 | b | a | b | b | a | b | b | a | a | b | a | B |
| | G-63 | 350 | 226 | b | a | b | b | a | b | b | a | a | b | a | B |
| | G-64 | 370 | 220 | b | a | b | b | a | b | b | a | a | b | a | B |
| | G-65 | 350 | 232 | b | a | b | b | a | b | b | a | a | b | a | B |
| | G-66 | 370 | 230 | b | a | b | b | a | b | b | a | a | b | a | B |
| | G-67 | 350 | 234 | b | a | b | b | a | b | b | a | a | b | a | B |
| | G-68 | 370 | 221 | b | a | b | b | a | b | b | a | a | b | a | B |
| | G-69 | 350 | 225 | b | a | b | b | a | b | b | a | a | b | a | B |
| | G-70 | 350 | 231 | b | a | b | b | a | b | b | a | a | b | a | B |
| | G-71 | 350 | 227 | b | a | b | b | a | b | b | a | a | b | a | B |
| COMPAR- | G-72 | 310 | 196 | c | c | c | c | c | c | c | c | c | c | c | C |
| ATIVE | G-73 | 310 | 201 | c | c | c | c | c | c | c | c | c | c | c | C |
| EXAMPLE | G-74 | 310 | 199 | c | c | c | c | c | c | c | c | c | c | c | C |
| | G-75 | 310 | 173 | d | c | d | d | c | d | d | d | c | d | c | C |
| | G-76 | 320 | 168 | d | c | d | d | c | d | d | d | c | d | c | C |
| | G-77 | 320 | 178 | d | c | d | d | c | d | d | d | c | d | c | C |

Example 2

In this example, metal particles contained in the die bonding member, which are used to produce the heat-dissipating structure and the semiconductor module illustrated in FIGS. 1 to 3, were examined. Spherical particles made of Ag, Al, Sn, and Cu were used as metal particles. When the metal particle was made of Ag, Al, and Cu, the particle size of the used metal particle was 45 μm or less. When the metal particle was made of Sn, the particle size of the used metal particle was 38 μm or less. Further, Example G-30 and G-34 illustrated in Table 1 and Table 2 were used as a lead-free low-melting glass composition contained in the die bonding member. The average particle size of these lead-free low-melting glass compositions was set to 2 μm or less. Ratios of the lead-free low-melting glass composition and the metal particles were set to 30:70 based on vol %, and a sample used to evaluate thermal conductivity was produced in the same manner as Example 1. However, at the time of the production of this sample, moldings were heated not in the air but in an inert gas (argon) so that the metal particles were not oxidized as much as possible. As a result, sintered bodies were obtained.

The thermal conductivity of each of the obtained sintered bodies was measured by using a xenon flash method in the same manner as Example 1. Further, each paste for the die bonding member was produced in the same manner as Example 1 with the same blending ratios as the abovementioned blending ratios by using the metal particles and the powder of the lead-free low-melting glass composition. Then, various joined bodies were produced in the same manner as Example 1 by using the paste, and the bondability of each joined body was evaluated by using shear stress. However, at the time of the production of each joined body, the air was not used and an inert gas (argon) was used as a heating atmosphere for every joined body.

Table 4 illustrates the bonding temperature and the thermal conductivity of die bonding members containing the lead-free low-melting glass compositions G-30 and G-34 and the results of evaluation of the bondability of joined bodies using the die bonding members. Meanwhile, as in Example 1, bonding temperatures were set to temperatures higher than the softening points $T_s$ of lead-free low-melting glass compositions to be used, which were G-30 and G-34 here, by a temperature in the range of 50 to 60° C. The thermal conductivities of the bulk of Ag, Al, Sn, and Cu are 429 W/mK, 237 W/mK, 67 W/mK, and 401 W/mK. These thermal conductivities are the thermal conductivities of pure metal. It is well known that a melting point and bonding temperature can be lowered but the thermal conductivity is extremely lowered when alloying i performed using eutectic and the like.

For example, the thermal conductivity of tin-based solder or active silver solder, which has been used as the die bonding member in the past, is in the range of about 20 to 70 W/mK. In the die bonding member containing the lead-free low-melting glass composition as in this example, there is also a great advantage that pure metal can be used as metal particles and pure metal particles can be subjected to necking at a low temperature. This will be proved in this example.

In a die bonding member containing 70 vol % of Ag as metal particles, the lead-free low-melting glass compositions G-30 and G-34 had a thermal conductivity of about 160 W/mK as illustrated in Table 4. The thermal conductivity of about 160 W/mK was significantly lower than the thermal conductivity of the bulk of Ag but was much higher than that of tin-based solder or active silver solder in the related art, and the necking of Ag particles was promoted by G-30 or G-34. The reason for this is considered that a part of Ag particles are melted in the glass by the softening and flowing of G-30 or G-34, Ag nanoparticles are precipitated from the glass, and necking proceeds by a mechanism where the necking of the Ag particles proceeds.

Further, since shear stress of 20 MPa or more was obtained in every joined body of (1) to (11), the bondability of the produced joined body was good. Particularly, since very high shear stress of 30 MPa or more was achieved in each of the joined bodies (2), (5), (8), (9), and (11) where an Al film or an Ag film was formed on the bonding surface, the bondability of the produced joined body was excellent. The reason for this is that G-30 or G-34 has good wettability to the Al film or the Ag film and reacts appropriately.

In a die bonding member containing 70 vol % of Al as metal particles, the lead-free low-melting glass compositions G-30 and G-34 had a thermal conductivity of about 90 W/mK as illustrated in Table 4. The thermal conductivity of about 90 W/mK was significantly lower than the thermal conductivity of the bulk of Al but was higher than that of tin-based solder or active silver solder in the related art, and the necking of Al particles was promoted by G-30 or G-34. The reason for this is considered that oxide films formed on the surfaces of Al particles are removed by the softening and flowing of G-30 or G-34, Al and V contained in the glass react with each other, an alloy layer of Al and V is formed, Ag nanoparticles are precipitated from the glass, and necking proceeds by a mechanism where the necking of the Al particles proceeds.

Further, since shear stress of 20 MPa or more was obtained in every joined body of (1) to (11), the bondability of the produced joined body was good. Particularly, since very high shear stress of 30 MPa or more was achieved in each of the joined bodies (2), (5), (8), (9), and (11) where an Al film or an Ag film was formed on the bonding surface, the bondability of the produced joined body was excellent. The reason for this is that G-30 or G-34 has good wettability to the Al film or the Ag film and reacts appropriately as in the case in which Ag particles are contained.

In a die bonding member containing 70 vol % of Sn as metal particles, the lead-free low-melting glass compositions G-30 and G-34 had a thermal conductivity of about 40 W/mK as illustrated in Table 4. The thermal conductivity of about 40 W/mK was lower than the thermal conductivity of the bulk of Sn but was equal to that of tin-based solder in the related art.

Furthermore, since shear stress of 20 MPa or more was obtained in every joined body of (1) to (11), the bondability of the produced joined body was good. Particularly, since very high shear stress of 30 MPa or more was achieved in each of the joined body (4) where a Cu base material was used and the joined bodies (5), (8), (10), and (11) where a Cu film or an Ag film was formed on the bonding surface, the bondability of the produced joined body was excellent. The reason for this is that bondability to the Cu base material or the Cu film is improved by the contained Sn particles. Solder in the related art can be bonded to Cu or Ag, but bondability between the solder in the related art and Al or ceramics was insufficient. In contrast, in this example using Sn particles, the thermal conductivity of the die bonding member was substantially equal to the thermal conductivity of the tin-based solder in the related art since the thermal conductivity of Sn is not higher than that of Ag or the like. However, since the lead-free low-melting glass composition according to this example was contained, the die bonding member could be also bonded to Al and ceramics besides Cu and Ag.

In a die bonding member containing 70 vol % of Cu as metal particles, the lead-free low-melting glass compositions G-30 and G-34 had a thermal conductivity of about 90 W/mK as illustrated in Table 4. The thermal conductivity of about 90 W/mK was significantly lower than the thermal conductivity of the bulk of Cu but was higher than that of tin-based solder or active silver solder in the related art, and the necking of Cu particles was promoted by G-30 or G-34. The reason for this is considered that a part of Cu particles are melted in the glass by the softening and flowing of G-30 or G-34 as in the case of the Ag particles, Ag nanoparticles are precipitated from the glass, and necking proceeds by a mechanism where the necking of the Cu particles proceeds. On the other hand, when G-30 or G-34, which is oxide glass, is softened and flows, the surface of the Cu particle may be oxidized. For this reason, it is thought that the thermal conductivity of the Cu particle is not increased up to the thermal conductivity of an Ag particle.

Further, since shear stress of 20 MPa or more was obtained in every joined body of (1) to (11), the bondability of the produced joined body was good. However, unlike in the cases of Ag particles, Al particles, and Sn particles, high shear stress of 30 MPa or more was not obtained in the case of the Cu particles. The reason for this was that the softening flowability of the glass became insufficient and the crystallization tendency of the glass was increased as Cu is melted in the glass of G-30 or G-34.

In the heat-dissipating structure and the semiconductor module of this example, it was found that Ag, Al, Sn, and Cu could be applied as the metal particles to be contained in the die bonding member. Particularly, the containing of the Ag particles allowed thermal conductivity to be increased and allowed the die bonding member to be excellent in a heat dissipation property. Ag, Al, Sn, and Cu were examined as the metal particles in this example, but it goes without saying that other metal particles can be sufficiently applied when the lead-free low-melting glass composition according to this example is applied.

same manner as Example 1, and the heat dissipation properties thereof were evaluated. Further, pastes for the die bonding member were produced in the same manner as Example 1 with 10 types of the same blending ratios as described above by using the powder of G-42 and the Ag particles. Then, joined bodies including the AlN base material on which the Al film was formed and the Al—SiC base material on which the Al film was formed of (2) was produced in the same manner as Example 1 by using these pastes, and the bondability of each joined body was evaluated by using shear stress. However, at the time of the production of the joined body of (2), an inert gas (nitrogen) was used as a heating atmosphere, and burning was performed at 300° C.

Figure 6:
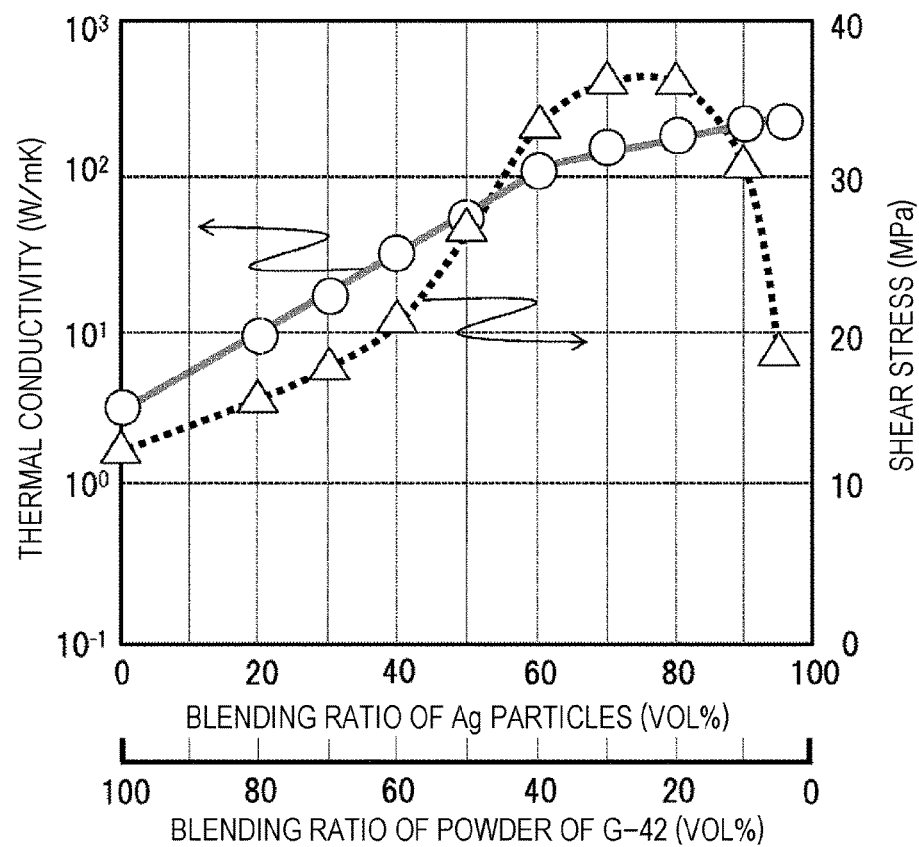
FIG. 6 is a graph illustrating an influence of blending ratios of a lead-free low-melting glass composition (G-42) and metal particles (Ag), which are contained in a die bonding member according to an example of the invention, on thermal conductivity and shear stress.

FIG. 6 illustrates a relationship between the blending ratios of the powder of G-42 and Ag particles, thermal conductivity, and shear stress. The thermal conductivity of the bulk of G-42 was about 0.6 W/mK, but the thermal conductivity of a sintered body produced using only the powder of G-42 (100 vol %) was increased to about 3 W/mK as illustrated in FIG. 6. The reason for this is considered that thermal conductivity was increased since Ag was precipitated from the glass. The change of thermal conductivity was increased by the increase of Ag particles and the decrease of the powder of G-42, and the thermal conductivity of the die bonding member became substantially equal to the thermal conductivity of lead-free tin-based solder in the related art

TABLE 4

| | | | | | RESULTS OF EVALUATION OF BONDABILITY | | | | | | | | | |
|---|---|---|---|---|---|---|---|---|---|---|---|---|---|---|
| GLASS No. | METAL PARTICLE | BONDING TEMPER- ATURE (° C.) | THERMAL CONDUC- TIVITY (W/mk) | (1) AlN Al- SiC | (2) AlN/ Al FILM Al FILM/ Al- SiC | (3) Al Al- SiC | (4) Cu Al- SiC | (5) Cu/Aq FILM Al FILM/ Al-SiC | (6) Al AlN | (7) Cu AlN | (8) Cu/Aq FILM Al FILM/ AlN | (9) Si/Al FILM Al FILM/ AlN | (10) Si/Al FILM Cu FILM/ AlN | (11) Si/Al FILM Ag FILM/ AlN |
| G-30 | Ag | 330 | 165 | b | a | b | b | a | b | b | a | a | b | a |
| | Al | 330 | 86 | b | a | b | b | a | b | b | a | a | b | a |
| | Sn | 330 | 36 | b | b | b | a | a | b | b | a | b | a | a |
| | Cu | 330 | 85 | b | b | b | b | b | b | b | b | b | b | b |
| G-34 | Ag | 290 | 157 | b | a | b | b | a | b | b | a | a | b | a |
| | Al | 290 | 91 | b | a | b | b | a | b | b | a | a | b | a |
| | Sn | 290 | 42 | b | b | b | a | a | b | b | a | b | a | a |
| | Cu | 290 | 92 | b | b | b | b | b | b | b | b | b | b | b |

Example 3

In this example, blending ratios of a lead-free low-melting glass composition and metal particles contained in a die bonding member, which are used to produce the heat-dissipating structure and the semiconductor module illustrated in FIGS. 1 to 3, were examined. Example G-42 illustrated in Table 1 and Table 2 was used as a lead-free low-melting glass composition, and spherical Ag particles having an average particle size of 1.5 µm were used as metal particles. Blending ratios of the powder of glass G-42 and Ag particles were set to 10 types of 100:0, 20:80, 30:70, 40:60, 50:50, 60:40, 70:30, 80:20, 90:10, and 95:5 based on vol %, and samples used to evaluate thermal conductivity were produced in the same manner as Example 1. Meanwhile, the average particle size of the powder of G-42 was set to 2 µm or less. Further, an inert gas (nitrogen) was used as a heating atmosphere, and sintered bodies were obtained at 300° C.

The thermal conductivity of each of the obtained sintered bodies was measured by using a xenon flash method in the when 40 vol % of Ag particles and 60 vol % of the powder of G-42 were contained. Further, when 60 vol % or more of Ag particles and 40 vol % of less of the powder of G-42 were contained, a thermal conductivity of 100 W/mK or more higher than the thermal conductivity of the lead-free tin-based solder or active silver solder in the related art was obtained. The increase of Ag particles caused thermal conductivity to be improved since network caused by the necking of Ag particles became compact. Since the necking is caused by the softening and flowing of G-42, the containing of G-42 is essential.

Shear stress was increased by the increase of Ag particles and the decrease of the powder of G-42 as illustrated in FIG. 6, had the maximum value when the content of Ag particles was in the range of 70 to 80 vol % and the content of the powder of G-42 was in the range of 20 to 30 vol %, and was significantly reduced afterward. A range, in which shear stress was 20 MPa or more and good bondability was obtained, was a range in which the content of Ag particles was 40 vol % or more and was smaller than 95 vol % and the content of the powder of G-42 was larger than 5 vol % and was 60 vol % or less. Particularly, excellent shear stress of 30 MPa or more was obtained in a range in which the content of Ag particles was in the range of 55 vol % to 90 vol % and the content of the powder of G-42 was in the range of 10 vol % to 45 vol %.

Considering both thermal conductivity and shear stress, that is, a heat dissipation property and bondability, it was preferable that the content of the lead-free low-melting glass composition contained in the die bonding member was in the range of 5 to 60 vol % and the content of the metal particles was in the range of 40 to 95 vol %. Particularly, it was effective that the content of the lead-free low-melting glass composition was in the range of 10 to 40 vol % and the content of the metal particles was in the range of 60 to 90 vol %.

Example 4

In this example, the heat-dissipating structure illustrated in FIGS. 1 and 2 was produced using the knowledge of Examples 1 to 3 and a heat cycle test was performed. An AlN substrate having a width of 30 mm, a length of 40 mm, and a thickness of 0.635 mm was used as each of the first members 1, 1', 1", and 1''' illustrated in FIG. 1; and an Al—SiC substrate having a width of 80 mm, a length of 100 mm, and a thickness of 5.0 mm was used as the second member 2. In the die bonding members 3, 3', 3", and 3''', Example G-50 illustrated in Table 1 and Table 2 was used as a lead-free low-melting glass composition, spherical Ag particles having an average particle size of 1.5 μm were used as metal particles, and ratios of the lead-free low-melting glass composition and the metal particles were set to 20:80 based on vol %. Further, an average particle size of G-50 was set to 2 μm or less.

A paste for the die bonding member was produced in the same manner as Example 1 by using the powder of G-50 and the Ag particles. This paste was applied to the bonding surface of each of the AlN substrates and the Al—SiC substrate by a screen printing method, and was dried in the air at a temperature in the range of 120 to 150° C. Next, the AlN substrates and the Al—SiC substrate were heated in the air by an electric furnace up to 220° C. at a rate of temperature rise of 10° C./minute, were kept for 30 minutes, were heated up to 280° C. at the same rate of temperature rise, and then were kept for 30 minutes. As a result, die bonding members were temporarily burned on the bonding surfaces of the AlN substrates and the Al—SiC substrate. The AlN substrates and the Al—SiC substrate were combined with each other, were heated up to 300° C. under a pressure of 0.5 MPa in a vacuum by a hot press, and were kept for 30 minutes. As a result, the heat-dissipating structure illustrated in FIG. 1 was produced. The bonding state of the produced heat-dissipating structure, in which peeling or the like also did not occur and the substrates were bonded to each other well, was confirmed by using an ultrasonic flaw detecting method. Further, it goes without saying that the thermal conductivity of the die bonding member of this example is high and the produced heat-dissipating structure has a high heat dissipation property as described in Examples 1 to 3.

The produced heat-dissipating structure was put in a heat cycle tester and a heat cycle from −40 to +150° C. was repeated 1000 times. The bonding state of the heat-dissipating structure having been subjected to the heat cycle test was evaluated by using an ultrasonic flaw detecting method. As a result, it was confirmed that the change of the heat-dissipating structure before and after the heat cycle test was not recognized and the heat-dissipating structure had good heat cycle characteristics.

Example 5

In this example, the heat-dissipating structure illustrated in FIGS. 1 and 2 was produced using the knowledge of Examples 1 to 3 as in Example 4 and a heat cycle test was performed. A Si substrate having a width of 15 mm, a length of 20 mm, and a thickness of 1.0 mm was used as each of the first members 1, 1', 1", and 1''' illustrated in FIG. 1; and an AlN substrate having a width of 40 mm, a length of 50 mm, and a thickness of 0.635 mm was used as the second member 2. In addition, an Al film having a thickness in the range of 1 to 2 μm was formed on the bonding surfaces of the Si substrates by a sputtering method; and an Al film having a thickness in the range of about 100 to 200 μm was formed on the bonding surface of the AlN substrate by a low-pressure cold spray, using spherical Al particles having a particle size of 75 μm or less. Meanwhile, at the time of the formation of the Al film on the bonding surface of the AlN substrate, the Al film was formed not only on portions of the AlN substrate to which the Si substrates were to be bonded but also on the entire surface of the AlN substrate. In the die bonding members 3, 3', 3", and 3''', Example G-61 illustrated in Table 1 and Table 2 was used as a lead-free low-melting glass composition, spherical Ag particles having an average particle size of 1.5 μm were used as metal particles, and ratios of the lead-free low-melting glass composition and the metal particles were set to 15:85 based on vol %. Further, an average particle size of G-61 was set to 2 μm or less.

A paste for the die bonding member was produced in the same manner as Example 1 by using the powder of G-61 and the Ag particles. This paste was applied to the bonding surface of each of the Si substrates and the AlN substrate, on which the Al film was formed, by a screen printing method, and was dried in the air at a temperature in the range of 120 to 150° C. Next, the Si substrates and the AlN substrate were heated in an inert gas (nitrogen) by an electric furnace up to 220° C. at a rate of temperature rise of 10° C./minute, were kept for 30 minutes, were heated up to 330° C. at the same rate of temperature rise, and then were kept for 30 minutes. As a result, a die bonding member was temporarily burned on each bonding surface. The Si substrates and the AlN substrate were combined with each other, were heated up to 350° C. under a pressure of 1 MPa in a vacuum by a hot press, and were kept for 30 minutes. As a result, the heat-dissipating structure illustrated in FIG. 1 was produced. The bonding state of the produced heat-dissipating structure, in which peeling or the like also did not occur and the substrates were bonded to each other well, was confirmed by using an ultrasonic flaw detecting method. Further, it goes without saying that the thermal conductivity of the die bonding member of this example is high and the produced heat-dissipating structure has a high heat dissipation property as described in Examples 1 to 3.

The produced heat-dissipating structure was put in a heat cycle tester and a heat cycle from −40 to +150° C. was repeated 1000 times. The bonding state of the heat-dissipating structure having been subjected to the heat cycle test was evaluated by using an ultrasonic flaw detecting method. As a result, it was confirmed that the change of the heat-dissipating structure before and after the heat cycle test was not recognized and the heat-dissipating structure had good heat cycle characteristics.

Example 6

In this example, the heat-dissipating structure illustrated in FIGS. 1 and 2 was produced using the knowledge of Examples 1 to 3 as in Example 4 and a heat cycle test was performed. An AlN substrate having a width of 30 mm, a length of 40 mm, and a thickness of 0.635 mm was used as each of the first members 1, 1', 1", and 1''' illustrated in FIG. 1; and an Al—SiC substrate having a width of 80 mm, a length of 100 mm, and a thickness of 5.0 mm was used as the second member 2. In addition, an Al film having a thickness in the range of about 100 to 200 μm was formed on each of the bonding surfaces of the AlN substrates and the Al—SiC substrate by a low-pressure cold spray, using granular Al particles having a particle size of 75 μm or less. Meanwhile, at the time of the formation of the Al film on the bonding surface of the Al—SiC substrate, the Al film was formed not only on portions of the Al—SiC substrate to which the AlN substrates were to be bonded but also on the entire surface of the Al—SiC substrate. In the die bonding members 3, 3', 3", and 3''', Example G-58 illustrated in Table 1 and Table 2 was used as a lead-free low-melting glass composition, spherical Ag particles having an average particle size of 1.5 μm were used as metal particles, and ratios of the lead-free low-melting glass composition and the metal particles were set to 25:75 based on vol %. Further, an average particle size of G-58 was set to 2 μm or less.

A paste for the die bonding member was produced in the same manner as Example 1 by using the powder of G-58 and the Ag particles. This paste was applied to the bonding surface of each of the AlN substrates and the Al—SiC substrate, on which the Al film was formed, by a screen printing method, and was dried in the air at a temperature in the range of 120 to 150° C. Next, the AlN substrates and the Al—SiC substrate were heated in the air by an electric furnace up to 220° C. at a rate of temperature rise of 10° C./minute, were kept for 30 minutes, were heated up to 280° C. at the same rate of temperature rise, and then were kept for 30 minutes. As a result, a die bonding member was temporarily burned on each bonding surface. The AlN substrates and the Al—SiC substrate were combined with each other, were heated up to 300° C. under a pressure of 0.5 MPa in a vacuum by a hot press, and were kept for 30 minutes. As a result, the heat-dissipating structure illustrated in FIG. 1 was produced. The bonding state of the produced heat-dissipating structure, in which peeling or the like also did not occur and the substrates were bonded to each other well, was confirmed by using an ultrasonic flaw detecting method. Further, it goes without saying that the thermal conductivity of the die bonding member of this example is high and the produced heat-dissipating structure has a high heat dissipation property as described in Examples 1 to 3.

The produced heat-dissipating structure was put in a heat cycle tester and a heat cycle from −40 to +175° C. was repeated 1000 times. The bonding state of the heat-dissipating structure having been subjected to the heat cycle test was evaluated by using an ultrasonic flaw detecting method. As a result, it was confirmed that the change of the heat-dissipating structure before and after the heat cycle test was not recognized and the heat-dissipating structure had good heat cycle characteristics.

Example 7

In this example, the heat-dissipating structure illustrated in FIGS. 1 and 2 was produced using the knowledge of Examples 1 to 3 as in Example 4 and a heat cycle test was performed. An AlN substrate having a width of 30 mm, a length of 40 mm, and a thickness of 0.635 mm was used as each of the first members 1, 1', 1", and 1''' illustrated in FIG. 1; and an Al—SiC substrate having a width of 80 mm, a length of 100 mm, and a thickness of 5.0 mm was used as the second member 2. In the die bonding members 3, 3', 3", and 3''', Example G-38 illustrated in Table 1 and Table 2 was used as a lead-free low-melting glass composition, spherical Al particles having a particle size of 75 μm or less were used as metal particles, and ratios of the lead-free low-melting glass composition and the metal particles were set to 30:70 based on vol %. Further, an average particle size of G-38 was set to 2 μm or less.

The powder of G-38 and the Al particles were mixed to each other so as to be uniform as much as possible, and a mixture film made of a mixture of glass and Al was formed on each of the bonding surfaces of the AlN substrates and the Al—SiC substrate by a low-pressure cold spray, using this mixed powder, so as to have a thickness in the range of about 100 to 200 μm. Meanwhile, at the time of the formation of the mixture film on the bonding surface of the Al—SiC substrate, the mixture film, which was made of a mixture of glass and Al, was formed not only on portions of the Al—SiC substrate to which the AlN substrates were to be bonded but also on the entire surface of the Al—SiC substrate. The AlN substrates and the Al—SiC substrate were combined with each other, were heated up to 310° C. under a pressure of 0.8 MPa in a vacuum by a hot press, and were kept for 30 minutes. As a result, the heat-dissipating structure illustrated in FIG. 1 was produced. The bonding state of the produced heat-dissipating structure, in which peeling or the like also did not occur and the substrates were bonded to each other well, was confirmed by using an ultrasonic flaw detecting method. Further, it goes without saying that the thermal conductivity of the die bonding member of this example is high and the produced heat-dissipating structure has a high heat dissipation property as described in Examples 1 to 3.

The produced heat-dissipating structure was put in a heat cycle tester and a heat cycle from −40 to +200° C. was repeated 1000 times. The bonding state of the heat-dissipating structure having been subjected to the heat cycle test was evaluated by using an ultrasonic flaw detecting method. As a result, it was confirmed that the change of the heat-dissipating structure before and after the heat cycle test was not recognized and the heat-dissipating structure had good heat cycle characteristics.

Example 8

In this example, the heat-dissipating structure illustrated in FIGS. 1 and 2 was produced using the knowledge of Examples 1 to 3 as in Example 4 and a heat cycle test was performed. A SiC substrate having a width of 15 mm, a length of 20 mm, and a thickness of 1.0 mm was used as each of the first members 1, 1', 1", and 1''' illustrated in FIG. 1; and an AlN substrate having a width of 40 mm, a length of 50 mm, and a thickness of 0.635 mm was used as the second member 2. In the die bonding members 3, 3', 3", and 3''', Example G-46 illustrated in Table 1 and Table 2 was used as a lead-free low-melting glass composition, spherical Al particles having a particle size of 75 μm or less were used as metal particles, and ratios of the lead-free low-melting glass composition and the metal particles were set to 10:90 based on vol %. Further, an average particle size of G-46 was set to 2 μm or less.

The powder of G-46 and the Al particles were mixed to each other so as to be uniform as much as possible, and a mixture film made of a mixture of glass and Al was formed on each of the bonding surfaces of the SiC substrates and the AlN substrate by a low-pressure cold spray, using this mixed powder, so as to have a thickness in the range of about 100 to 200 μm. Meanwhile, at the time of the formation of the mixture film on the bonding surface of the AlN substrate, the mixture film, which was made of a mixture of glass and Al, was formed not only on portions of the AlN substrate to which the SiC substrates were to be bonded but also on the entire surface of the AlN substrate. The SiC substrates and the AlN substrate were combined with each other, were heated up to 340° C. under a pressure of 1.2 MPa in a vacuum by a hot press, and were kept for 30 minutes. As a result, the heat-dissipating structure illustrated in FIG. 1 was produced. The bonding state of the produced heat-dissipating structure, in which peeling or the like also did not occur and the substrates were bonded to each other well, was confirmed by using an ultrasonic flaw detecting method. Further, it goes without saying that the thermal conductivity of the die bonding member of this example is high and the produced heat-dissipating structure has a high heat dissipation property as described in Examples 1 to 3.

The produced heat-dissipating structure was put in a heat cycle tester and a heat cycle from −40 to +200° C. was repeated 1000 times. The bonding state of the heat-dissipating structure having been subjected to the heat cycle test was evaluated by using an ultrasonic flaw detecting method. As a result, it was confirmed that the change of the heat-dissipating structure before and after the heat cycle test was not recognized and the heat-dissipating structure had good heat cycle characteristics.

Example 9

In this example, the semiconductor module illustrated in FIG. 3 was produced using the knowledge of Examples 1 to 8 and a heat cycle test was performed. A Si chip having a size of about 12 mm×10 mm×0.5 mm was used as the semiconductor chip 6 illustrated in FIG. 3; a Cu wire having a thickness of about 0.3 mm was used as each of the metal wires 7, 7', and 7"; an AlN substrate having a size of about 60 mm×50 mm×0.635 mm was used as the ceramic insulating substrate 8; an Al—SiC substrate having a size of about 160 mm×180 mm×5 mm was used as the heat-dissipating base substrate 9; a die bonding member containing the lead-free low-melting glass composition according to the above-mentioned example and metal particles was used as each of the first die bonding member 10 and the third die bonding member 12; and active silver solder in the related art was used as each of the second die bonding members 11, 11', and 11".

The Cu wires used as the metal wires 7, 7', and 7" were bonded to the AlN substrate used as the ceramic insulating substrate 8 in advance by the second die bonding member 11, 11', and 11" made of active silver solder. At that time, using active silver solder, a Cu thin plate having a thickness of about 0.2 mm was also bonded to the opposite surface of the AlN substrate to prevent the warpage of the AlN substrate used as the ceramic insulating substrate 8. In this example, eight semiconductor chips 6 (Si chips) were mounted on the Cu wire-side surface of the AlN substrate, to which the Cu wires and the Cu thin plate were bonded by active silver solder, by using first die bonding members 10 to form a subassembly and six subassemblies were mounted on the heat-dissipating base substrate 9 (an Al—SiC substrate) by using third die bonding members 12, so that a semiconductor module was obtained.

The first die bonding member 10 and the third die bonding member 12 were used in the form of paste. In the first die bonding member 10, Example G-32 illustrated in Table 1 and Table 2 was used as a lead-free low-melting glass composition, spherical Ag particles having an average particle size of 1.5 μm were used as metal particles, and ratios of the lead-free low-melting glass composition and the metal particles were set to 15:85 based on vol %. Further, in the third die bonding member 12, Example G-35 illustrated in Table 1 and Table 2 was used as a lead-free low-melting glass composition, spherical Ag particles having an average particle size of 1.5 μm were used as metal particles, and ratios of the lead-free low-melting glass composition and the metal particles were set to 30:70 based on vol %. Meanwhile, an average particle size of each of G-32 and G-35 was set to 2 μm or less. A paste for the first die bonding member was produced in the same manner as Example 1 by using the powder of G-32 and the Ag particles, and a paste for the third die bonding member was produced in the same manner as Example 1 by using the powder of G-35 and the Ag particles.

A more detailed structure and a more detailed producing method will be described below. An Al film having a thickness in the range of 1 to 2 μm was formed on the bonding surface of each Si chip by a sputtering method. An Al film having a thickness in the range of about 100 to 200 μm was formed on each of the bonding surfaces of both the Cu wires and the Cu thin plate, which were bonded to the AlN substrate by active silver solder, and the bonding surface of the Al—SiC substrate by a low-pressure cold spray, using spherical Al particles having a particle size of 75 μm or less. Next, the paste for the first die bonding member was applied to each of the bonding surfaces of the Al films formed on the Si chips and the bonding surfaces of the Al films formed on the Cu wires by a screen printing method, and was dried in the air at a temperature in the range of 120 to 150° C. After drying, the Si chips and the Cu wires were heated in an inert gas (argon) by an electric furnace up to 220° C. at a rate of temperature rise of 10° C./minute, were kept for 30 minutes, were heated up to 310° C. at the same rate of temperature rise, and then were kept for 30 minutes. As a result, the first die bonding member was temporarily burned on each of the bonding surfaces. The Si chips and the Cu wires were combined with each other, were heated up to 330° C. under a pressure of 0.8 MPa in a vacuum by a hot press, and were kept for 30 minutes. As a result, the Si chips and the Cu wires were bonded to each other.

Next, the paste for the third die bonding member was applied to each of the bonding surface of the Al film formed on the Cu thin plate and the bonding surface of the Al film formed on the Al—SiC substrate by a screen printing method, and was dried in the air at a temperature in the range of 120 to 150° C. After drying, the Cu thin plate and the Al—SiC substrate were heated in an inert gas (argon) by an electric furnace up to 220° C. at a rate of temperature rise of 10° C./minute, were kept for 30 minutes, were heated up to 270° C. at the same rate of temperature rise, and then were kept for 30 minutes. As a result, the third die bonding member was temporarily burned on each of the bonding surfaces. The Cu thin plate and the Al—SiC substrate were combined with each other, were heated up to 290° C. under a pressure of 0.5 MPa in a vacuum by a hot press, and were kept for 30 minutes. As a result, the Cu thin plate and the Al—SiC substrate were bonded to each other.

Then, the emitter electrodes 13 and the gate electrode 14 were connected as illustrated in FIG. 3. As a result, the semiconductor module was produced. The bonding state of each of the first and third die bonding members 10 and 12 of the produced semiconductor module, in which peeling or the like also did not occur and the substrates were bonded to each other well, was confirmed by using an ultrasonic flaw detecting method. Further, it was also confirmed that the produced semiconductor module operated even at a high current density. Furthermore, it goes without saying that the thermal conductivity of each of the first and third die bonding members 10 and 12 of this example is high and the produced semiconductor module has a high heat dissipation property as described in Examples 1 to 3.

The produced semiconductor module was put in a heat cycle tester and a heat cycle from −40 to +150° C. was repeated 1000 times. The bonding state of each portion of the semiconductor module having been subjected to the heat cycle test was evaluated by using an ultrasonic flaw detecting method. As a result, it was confirmed that the change of the semiconductor module before and after the heat cycle test was not recognized and the semiconductor module had good heat cycle characteristics. Further, it was confirmed that the semiconductor module operated even at a high current density as in the case in which the test was not yet performed.

Example 10

In this example, the semiconductor module illustrated in FIG. 3 was produced in the same manner as Example 9 by using the knowledge of Examples 1 to 8 and a heat cycle test was performed. Elements, which were made of the same materials as the elements of Example 9 and had the same shapes as the elements of Example 9, were used as the semiconductor chip 6, the metal wires 7, 7', and 7", the ceramic insulating substrate 8, and the heat-dissipating base substrate 9 illustrated in FIG. 3. Moreover, as in Example 9, active silver solder in the related art was used as each of the second die bonding members 11, 11', and 11" and Cu wires and a Cu thin plate were bonded to an AlN substrate. Further, an Al film having a thickness in the range of 1 to 2 μm was formed on the bonding surface of each Si chip in the same manner as Example 9 by a sputtering method.

In the first die bonding member 10, Example G-55 illustrated in Table 1 and Table 2 was used as a lead-free low-melting glass composition, spherical Ag particles having a particle size of 75 μm or less were used as metal particles, and ratios of the lead-free low-melting glass composition and the metal particles were set to 20:80 based on vol %. Further, in the third die bonding member 12, Example G-47 illustrated in Table 1 and Table 2 was used as a lead-free low-melting glass composition, spherical Al particles having a particle size of 75 μm or less were used as metal particles, and ratios of the lead-free low-melting glass composition and the metal particles were set to 15:85 based on vol %. Meanwhile, an average particle size of each of G-55 and G-47 was set to 2 μm or less. At the time of the formation of the first and third die bonding members 10 and 12 of this example, the form of the paste applied in Example 9 was not applied, the powder of G-55 and the Ag particles were mixed to each other and the powder of G-47 and the Al particles were mixed to each other so as to be uniform as much as possible, and the first and third die bonding members 10 and 12 were formed by a low-pressure cold spray using these mixed powders.

A more detailed structure and a more detailed producing method will be described below. First, a film for the third die bonding member having a thickness in the range of about 100 to 200 μm was formed on each of the bonding surface of the Cu thin plate, which was bonded to the AlN substrate by active silver solder, and the bonding surface of the Al—SiC substrate by a low-pressure cold spray, using the mixed powder that was formed of the powder of G-47 and the Al particles. The Cu thin plate and the Al—SiC substrate were combined with each other, were heated up to 340° C. under a pressure of 1 MPa in a vacuum by a hot press, and were kept for 30 minutes. As a result, the Cu thin plate and the Al—SiC substrate were bonded to each other. Next, a film for the first die bonding member having a thickness in the range of about 100 to 200 μm was formed on each of the bonding surfaces of the Al films formed on the Si chips and the bonding surfaces of the Al films formed on the Cu wires by a low-pressure cold spray, using the mixed powder that was formed of the powder of G-55 and the Ag particles. The Si chips and the Cu wires were combined with each other, were heated up to 300° C. under a pressure of 0.7 MPa in a vacuum by a hot press, and were kept for 30 minutes. As a result, the Si chips and the Cu wires were bonded to each other.

Then, the emitter electrodes 13 and the gate electrode 14 were connected as illustrated in FIG. 3. As a result, the semiconductor module was produced. The bonding state of each of the first and third die bonding members 10 and 12 of the produced semiconductor module, in which peeling or the like also did not occur and the substrates were bonded to each other well, was confirmed by using an ultrasonic flaw detecting method. Further, it was also confirmed that the produced semiconductor module operated even at a high current density. Furthermore, it goes without saying that the thermal conductivity of each of the first and third die bonding members 10 and 12 of this example is high and the produced semiconductor module has a high heat dissipation property as described in Examples 1 to 3.

The produced semiconductor module was put in a heat cycle tester and a heat cycle from −40 to +150° C. was repeated 1000 times in the same manner as Example 9. The bonding state of each portion of the semiconductor module having been subjected to the heat cycle test was evaluated by using an ultrasonic flaw detecting method. As a result, it was confirmed that the change of the semiconductor module before and after the heat cycle test was not recognized and the semiconductor module had good heat cycle characteristics. Further, it was confirmed that the semiconductor module operated even at a high current density as in the case in which the test was not yet performed.

Example 11

In this example, the semiconductor module illustrated in FIG. 3 was produced using the knowledge of Examples 1 to 8 in the same manner as Examples 9 and 10 and a heat cycle test was performed. A Si chip having a size of about 12 mm×10 mm×0.5 mm was used as each semiconductor chip 6 illustrated in FIG. 3; an Al wire having a thickness of about 0.5 mm was used as each of the metal wires 7, 7', and 7"; an AlN substrate having a size of about 60 mm×50 mm×0.635 mm was used as the ceramic insulating substrate 8; and an Al—SiC substrate having a size of about 160 mm×180 mm×5 mm was used as the heat-dissipating base substrate 9.

Further, a die bonding member containing the lead-free low-melting glass composition according to the above-mentioned example and metal particles was used as each of the first die bonding member 10, the second die bonding members 11, 11', and 11", and the third die bonding member 12. An Al film having a thickness in the range of 1 to 2 μm was formed on each of the bonding surfaces of the Si chips and both bonding surfaces of the AlN substrate in the same manner as Example 9 by a sputtering method. Meanwhile, the Al film was formed in the shape of the wires on the Al wire-side surface of the AlN substrate.

In the first die bonding member 10, Example G-51 illustrated in Table 1 and Table 2 was used as a lead-free low-melting glass composition, spherical Ag particles having a particle size of 75 μm or less were used as metal particles, and ratios of the lead-free low-melting glass composition and the metal particles were set to 15:85 based on vol %. Further, in the second die bonding members 11, 11', and 11" and the third die bonding member 12, Example G-59 illustrated in Table 1 and Table 2 was used as a lead-free low-melting glass composition, spherical Al particles having a particle size of 75 μm or less were used as metal particles, and ratios of the lead-free low-melting glass composition and the metal particles were set to 25:75 based on vol %. Meanwhile, an average particle size of each of G-51 and G-59 was set to 2 μm or less. At the time of the formation of the first die bonding member 10, the second die bonding members 11, 11', and 11", and the third die bonding member 12 of this example, the powder of G-51 and the Ag particles were mixed to each other and the powder of G-59 and the Al particles were mixed to each other so as to be uniform as much as possible as in Example 10, and the die bonding members were formed by a low-pressure cold spray using these mixed powders.

A more detailed structure and a more detailed producing method will be described below. First, a film for the second die bonding member having a thickness in the range of about 100 to 200 μm was formed on each of the bonding surfaces of the Al films formed on both the surfaces of the AlN substrate and a film for the third die bonding member having a thickness in the range of about 100 to 200 μm was formed on the bonding surface of the Al—SiC substrate, by a low-pressure cold spray, using the mixed powder that was formed of the powder of G-59 and the Al particles. The AlN substrate and the Al—SiC substrate were combined with each other, Al wires were further installed on the film for the second die bonding member, and the AlN substrate and the Al—SiC substrate were heated up to 330° C. under a pressure of 0.7 MPa in a vacuum by a hot press and were kept for 30 minutes. As a result, the AlN substrate and the Al—SiC substrate were bonded to each other. Next, a film for the first die bonding member having a thickness in the range of about 100 to 200 μm was formed on each of the bonding surfaces of the Al films formed on the Si chips and the bonding surfaces of the Al wires by a low-pressure cold spray, using the mixed powder that was formed of the powder of G-51 and the Ag particles. The Si chips and the Al wires were combined with each other, were heated up to 300° C. under a pressure of 0.9 MPa in a vacuum by a hot press, and were kept for 30 minutes. As a result, the Si chips and the Al wires were bonded to each other.

Then, the emitter electrodes 13 and the gate electrode 14 were connected as illustrated in FIG. 3. As a result, the semiconductor module was produced. The bonding state of each of the first die bonding member 10, the second die bonding members 11, 11', and 11", and the third die bonding member 12 of the produced semiconductor module, in which peeling or the like also did not occur and the substrates were bonded to each other well, was confirmed by using an ultrasonic flaw detecting method. Further, it was also confirmed that the produced semiconductor module operated even at a high current density. Furthermore, it goes without saying that the thermal conductivity of each of the first, second, and third die bonding members of this example is high and the produced semiconductor module has a high heat dissipation property as described in Examples 1 to 3.

The produced semiconductor module was put in a heat cycle tester and a heat cycle from −40 to +175° C. was repeated 1000 times. The bonding state of each portion of the semiconductor module having been subjected to the heat cycle test was evaluated by using an ultrasonic flaw detecting method. As a result, it was confirmed that the change of the semiconductor module before and after the heat cycle test was not recognized and the semiconductor module had good heat cycle characteristics. Further, it was confirmed that the semiconductor module operated even at a high current density as in the case in which the test was not yet performed.

Example 12

In this example, the semiconductor module illustrated in FIG. 3 was produced using the knowledge of Examples 1 to 8 in the same manner as Examples 9 to 11 and a heat cycle test was performed. A SiC chip having a size of about 12 mm×10 mm×0.5 mm was used as each semiconductor chip 6 illustrated in FIG. 3; an Al wire having a thickness of about 0.5 mm was used as each of the metal wires 7, 7', and 7"; an AlN substrate having a size of about 60 mm×50 mm×0.635 mm was used as the ceramic insulating substrate 8; and an Al—SiC substrate having a size of about 160 mm×180 mm×5 mm was used as the heat-dissipating base substrate 9. Further, a die bonding member containing the lead-free low-melting glass composition according to the above-mentioned example and metal particles was used as each of the first die bonding member 10, the second die bonding members 11, 11', and 11", and the third die bonding member 12. An Al film having a thickness in the range of 1 to 2 μm was formed on each of the bonding surfaces of the SiC chips and both bonding surfaces of the AlN substrate in the same manner as Examples 9 and 11 by a sputtering method. Meanwhile, the Al film was formed in the shape of the wires on the Al wire-side surface of the AlN substrate.

In the first die bonding member 10, Example G-23 illustrated in Table 1 and Table 2 was used as a lead-free low-melting glass composition, spherical Al particles having a particle size of 75 μm or less were used as metal particles, and ratios of the lead-free low-melting glass composition and the metal particles were set to 12:88 based on vol %. Further, in the second die bonding members 11, 11', and 11" and the third die bonding member 12, Example G-49 illustrated in Table 1 and Table 2 was used as a lead-free low-melting glass composition, spherical Al particles having a particle size of 75 μm or less were used as metal particles, and ratios of the lead-free low-melting glass composition and the metal particles were set to 20:80 based on vol %. Meanwhile, an average particle size of each of G-23 and G-49 was set to 2 μm or less. At the time of the formation of the first die bonding member 10, the second die bonding members 11, 11', and 11", and the third die bonding member 12 of this example, the powder of G-23 and the Al particles were mixed to each other and the powder of G-49 and the Al particles were mixed to each other so as to be uniform as much as possible as in Examples 10 and 11, and the die bonding members were formed by a low-pressure cold spray using these mixed powders.

A more detailed structure and a more detailed producing method will be described below. First, a film for the second die bonding member having a thickness in the range of about 100 to 200 μm was formed on each of the bonding surfaces of the Al films formed on both the surfaces of the AlN substrate and a film for the third die bonding member having a thickness in the range of about 100 to 200 μm was formed on the bonding surface of the Al—SiC substrate, by a low-pressure cold spray, using the mixed powder that was formed of the powder of G-49 and the Al particles. The AlN substrate and the Al—SiC substrate were combined with each other, Al wires were further installed on the film for the second die bonding member, and the AlN substrate and the Al—SiC substrate were heated up to 340° C. under a pressure of 1 MPa in a vacuum by a hot press and were kept for 30 minutes. As a result, the AlN substrate and the Al—SiC substrate were bonded to each other. Next, a film for the first die bonding member having a thickness in the range of about 100 to 200 μm was formed on each of the bonding surfaces of the Al films formed on the SiC chips and the bonding surfaces of the Al wires by a low-pressure cold spray, using the mixed powder that was formed of the powder of G-23 and the Al particles. The SiC chips and the Al wires were combined with each other, were heated up to 270° C. under a pressure of 0.7 MPa in a vacuum by a hot press, and were kept for 30 minutes. As a result, the SiC chips and the Al wires were bonded to each other.

Then, the emitter electrodes 13 and the gate electrode 14 were connected as illustrated in FIG. 3. As a result, the semiconductor module was produced. The bonding state of each of the first die bonding member 10, the second die bonding members 11, 11', and 11", and the third die bonding member 12 of the produced semiconductor module, in which peeling or the like also did not occur and the substrates were bonded to each other well, was confirmed by using an ultrasonic flaw detecting method. Further, it was also confirmed that the produced semiconductor module operated even at a high current density. Furthermore, it goes without saying that the thermal conductivity of each of the first, second, and third die bonding members of this example is high and the produced semiconductor module has a high heat dissipation property as described in Examples 1 to 3.

The produced semiconductor module was put in a heat cycle tester and a heat cycle from −40 to +200° C. was repeated 1000 times. The bonding state of each portion of the semiconductor module having been subjected to the heat cycle test was evaluated by using an ultrasonic flaw detecting method. As a result, it was confirmed that the change of the semiconductor module before and after the heat cycle test was not recognized and the semiconductor module had good heat cycle characteristics. Further, it was confirmed that the semiconductor module operated even at a high current density as in the case in which the test was not yet performed.

Example 13

In this example, the semiconductor module illustrated in FIG. 3 was produced using the knowledge of Examples 1 to 8 in the same manner as Examples 9 to 12 and a heat cycle test was performed. A SiC chip having a size of about 12 mm×10 mm×0.5 mm was used as each semiconductor chip 6 illustrated in FIG. 3; a Cu wire having a thickness of about 0.3 mm was used as each of the metal wires 7, 7', and 7"; a $Si_3N_4$ substrate having a size of about 60 mm×50 mm×0.635 mm was used as the ceramic insulating substrate 8; and an Al—SiC substrate having a size of about 160 mm×180 mm×5 mm was used as the heat-dissipating base substrate 9. Moreover, as in Example 9 or 10, active silver solder in the related art was used as each of the second die bonding members 11, 11', and 11" and the Cu wires and a Cu thin plate were bonded to the $Si_3N_4$ substrate. Further, an Al film having a thickness in the range of 1 to 2 μm was formed on the bonding surface of each SiC chip in the same manner as Example 12 by a sputtering method.

In the first die bonding member 10, Example G-30 illustrated in Table 1 and Table 2 was used as a lead-free low-melting glass composition, spherical Al particles having a particle size of 75 μm or less were used as metal particles, and ratios of the lead-free low-melting glass composition and the metal particles were set to 11:89 based on vol %. Further, in the third die bonding member 12, Example G-34 illustrated in Table 1 and Table 2 was used as a lead-free low-melting glass composition, spherical Al particles having a particle size of 75 μm or less were used as metal particles, and ratios of the lead-free low-melting glass composition and the metal particles were set to 18:82 based on vol %. Meanwhile, an average particle size of each of G-30 and G-34 was set to 2 μm or less. At the time of the formation of the first and third die bonding members 10 and 12 of this example, the powder of G-30 and the Al particles were mixed to each other and the powder of G-34 and the Al particles were mixed to each other so as to be uniform as much as possible as in Examples 10 to 12, and the first and third die bonding members 10 and 12 were formed by a low-pressure cold spray using these mixed powders.

A more detailed structure and a more detailed producing method will be described below. First, a film for the first die bonding member having a thickness in the range of about 100 to 200 μm was formed on each of the bonding surfaces of the Al films formed on the SiC chips and the bonding surfaces of the Cu wires, which were bonded to the $Si_3N_4$ substrate by active silver solder, by a low-pressure cold spray, using the mixed powder that was formed of the powder of G-30 and the Al particles. The SiC chips and the Cu wires were combined with each other, were heated up to 330° C. under a pressure of 1.2 MPa in a vacuum by a hot press, and were kept for 30 minutes. As a result, the Si chips and the Cu wires were bonded to each other. Next, a film for the third die bonding member having a thickness in the range of about 100 to 200 μm was formed on each of the bonding surface of the Cu thin plate, which was bonded to the $Si_3N_4$ substrate by active silver solder, and the bonding surface of the Al—SiC substrate by a low-pressure cold spray, using the mixed powder that was formed of the powder of G-34 and the Al particles. The Cu thin plate and the Al—SiC substrate were combined with each other, were heated up to 290° C. under a pressure of 0.8 MPa in a vacuum by a hot press, and were kept for 30 minutes. As a result, the Cu thin plate and the Al—SiC substrate were bonded to each other.

Then, the emitter electrodes 13 and the gate electrode 14 were connected as illustrated in FIG. 3. As a result, the semiconductor module was produced. The bonding state of each of the first and third die bonding members 10 and 12 of the produced semiconductor module, in which peeling or the like also did not occur and the substrates were bonded to each other well, was confirmed by using an ultrasonic flaw detecting method. Further, it was also confirmed that the produced semiconductor module operated even at a high current density. Furthermore, it goes without saying that the thermal conductivity of each of the first and third die bonding members 10 and 12 of this example is high and the produced semiconductor module has a high heat dissipation property as described in Examples 1 to 3.

The produced semiconductor module was put in a heat cycle tester and a heat cycle from −40 to +200° C. was repeated 1000 times as in the same manner as Example 12. The bonding state of each portion of the semiconductor module having been subjected to the heat cycle test was evaluated by using an ultrasonic flaw detecting method. As a result, it was confirmed that the change of the semiconductor module before and after the heat cycle test was not recognized and the semiconductor module had good heat cycle characteristics. Further, it was confirmed that the semiconductor module operated even at a high current density as in the case in which the test was not yet performed.

According to the above description, it is possible to provide a heat-dissipating structure and a semiconductor module which have good bondability, a high heat dissipation property, good heat resistance, and good heat cycle characteristics, that is, which are excellent in thermal reliability.

REFERENCE SIGNS LIST 1, 1', 1", 1'" first member
2 second member
3, 3', 3", 3'" die bonding member
4 lead-free low-melting glass composition
5 metal particle
6 semiconductor chip
7, 7', 7" metal wire
8 ceramic insulating substrate
9 heat-dissipating base substrate
10 first die bonding member
11, 11', 11" second die bonding member
12 third die bonding member
13 emitter electrode
14 gate electrode
15 disc-shaped base material
16 square plate-shaped base material
17 bonding surface
18 bonding surface
19 paste for die bonding member

The invention claimed is:

1. A heat-dissipating structure comprising:
a first member and a second member each of which is metal, ceramic, or a semiconductor and which are bonded to each other with a die bonding member, which contains a lead-free low-melting glass composition and metal particles, interposed therebetween,
wherein the lead-free low-melting glass composition contains oxides comprising $V_2O_5$, $TeO_2$, and $Ag_2O$ serving as main ingredients of which the total content of the oxides is 78 mol % or more of the lead-free low-melting glass composition,
the content of each of $TeO_2$ and $Ag_2O$ is 1 to 2 times the content of $V_2O_5$, and
the lead-free low-melting glass composition further contains one or more accessory ingredients selected from BaO, $WO_3$, and $P_2O_5$ of which the total content is 20 mol % or less of the lead-free low-melting glass composition, and one or more additional ingredients selected from $Y_2O_3$, $La_2O_3$, and $Al_2O_3$ of which the total content is 2.0 mol % or less of the lead-free low-melting glass composition.

2. The heat-dissipating structure according to claim 1, wherein a film made of Al, an Al alloy, Ag, or an Ag alloy is formed on a bonding surface of one or more of the first member or the second member, wherein the die bonding member is bonded to the bonding surface.

3. The heat-dissipating structure according to claim 1, wherein the content of the accessory ingredients of the lead-free low-melting glass composition, which is contained in the die bonding member, is in the range of 3.7 to 16 mol % and the content of the additional ingredients of the lead-free low-melting glass composition is in the range of 0.2 to 1.0 mol %.

4. The heat-dissipating structure according to claim 1, wherein the metal particles, which are contained in the die bonding member, contain one or more of Ag, Al, Sn, and Cu.

5. The heat-dissipating structure according to claim 1, wherein the die bonding member comprises 5 to 60 vol % of the lead-free low-melting glass composition and 40 to 95 vol % of the metal particles.

6. The heat-dissipating structure according to claim 5, wherein the die bonding member comprises 10 to 40 vol % of the lead-free low-melting glass composition and 60 to 90 vol % of the metal particles.

7. The heat-dissipating structure according to claim 1, wherein the first member is a semiconductor or metal, and the second member is metal or ceramic.

8. A semiconductor module comprising:
a semiconductor chip, a metal wire, a ceramic insulating substrate, and a heat-dissipating base substrate containing metal, wherein the semiconductor chip, the metal wire, the ceramic insulating substrate, and the heat-dissipating base substrate are bonded with die bonding members interposed therebetween, respectively,
wherein one or more of the die bonding members contain a lead-free low-melting glass composition and metal particles,
the lead-free low-melting glass composition contains oxides comprising $V_2O_5$, $TeO_2$, and $Ag_2O$ serving as main ingredients of which the total content of the oxides is 78 mol % or more of the lead-free low-melting glass composition,
the content of each of $TeO_2$ and $Ag_2O$ is 1 to 2 times the content of $V_2O_5$, and
the lead-free low-melting glass composition further contains one or more accessory ingredients selected from BaO, $WO_3$, and $P_2O_5$ of which the total content is 20 mol % or less of the lead-free low-melting glass composition, and one or more additional ingredients selected from $Y_2O_3$, $La_2O_3$, and $Al_2O_3$ of which the total content is 2.0 mol % or less of the lead-free low-melting glass composition.

9. The semiconductor module according to claim 8, wherein a film made of Al, an Al alloy, Ag, or an Ag alloy is formed on bonding surfaces of the semiconductor chip, the metal wire, the ceramic insulating substrate, and the heat-dissipating base substrate to which the die bonding members containing the lead-free low-melting glass composition and the metal particles are bonded.

10. The semiconductor module according to claim 8, wherein the content of the accessory ingredients of the lead-free low-melting glass composition, which is contained in the die bonding member, is in the range of 3.7 to 16 mol % and the content of the additional ingredients of the lead-free low-melting glass composition is in the range of 0.2 to 1.0 mol %.

11. The semiconductor module according to claim 8, wherein the metal particles, which are contained in the die bonding member, contain one or more of Ag, Al, Sn, and Cu.

12. The semiconductor module according to claim 8, wherein the die bonding member contains 5 to 60 vol % of the lead-free low-melting glass composition and 40 to 95 vol % of the metal particles.

13. The semiconductor module according to claim 12, wherein the die bonding member comprises 10 to 40 vol % of the lead-free low-melting glass composition and 60 to 90 vol % of the metal particles.

* * * * *